United States Patent
Beck et al.

(10) Patent No.: US 9,680,421 B2
(45) Date of Patent: Jun. 13, 2017

(54) GROUND FAULT CIRCUIT INTERRUPTER AND METHOD

(71) Applicant: SEMICONDUCTOR COMPONENTS INDUSTRIES, LLC, Phoenix, AZ (US)

(72) Inventors: Riley D. Beck, Eagle Mountain, UT (US); Kent D. Layton, Lehi, UT (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/132,775

(22) Filed: Apr. 19, 2016

(65) Prior Publication Data

US 2016/0233837 A1    Aug. 11, 2016

Related U.S. Application Data

(60) Division of application No. 13/829,366, filed on Mar. 14, 2013, now Pat. No. 9,331,469, which is a
(Continued)

(51) Int. Cl.
*G01R 31/14* (2006.01)
*H03F 1/30* (2006.01)
(Continued)

(52) U.S. Cl.
CPC .......... *H03F 1/303* (2013.01); *G01R 27/18* (2013.01); *G01R 31/025* (2013.01);
(Continued)

(58) Field of Classification Search
CPC .............. G01R 31/025; H02H 1/0092; H03F 2203/45288; H03F 2203/45
(Continued)

(56) References Cited

U.S. PATENT DOCUMENTS 3,794,884 A    2/1974 Sircom
3,879,639 A    4/1975 Sircom
(Continued)

OTHER PUBLICATIONS

Kugelstadt, Thomas. "Auto-zero amplifiers ease the design of high-precision circuits." 2$^{nd}$ quarter, 2005, Analog Applications Journal, Texas Instruments Incorporated.*

(Continued)

*Primary Examiner* — Patrick Assouad
*Assistant Examiner* — Sean Curtis
(74) *Attorney, Agent, or Firm* — Rennie William Dover

(57) ABSTRACT

A method and circuit for dynamically correcting offsets associated with an AC power system. In an embodiment, a first offset current generated in response to a ground to neutral fault stimulus is decreased and a second offset current generated in response to a differential fault stimulus is decreased. In another embodiment, the circuit includes an offset correction circuit that has one of a chopper circuit or an auto-zeroing circuit. An amplifier is connected to the offset correction circuit and an output connected to the offset correction circuit. A signal generator is switchably coupled to a first input of the offset correction circuit and a bias generator is switchably coupled to the first input of the offset correction circuit.

15 Claims, 13 Drawing Sheets

Related U.S. Application Data continuation-in-part of application No. 12/572,870, filed on Oct. 2, 2009, now Pat. No. 8,390,297.

(51) Int. Cl.

| | | |
|---|---|---|
| *H02H 3/16* | (2006.01) | |
| *G01R 27/18* | (2006.01) | |
| *H02H 3/33* | (2006.01) | |
| *G01R 31/02* | (2006.01) | |
| *H03F 3/45* | (2006.01) | |
| *H02H 1/00* | (2006.01) | |
| *H02H 1/04* | (2006.01) | |

(52) U.S. Cl.
CPC ............ *H02H 3/162* (2013.01); *H02H 3/33* (2013.01); *H03F 3/45* (2013.01); *H02H 1/0092* (2013.01); *H02H 1/04* (2013.01); *H03F 2203/45152* (2013.01); *H03F 2203/45228* (2013.01); *H03F 2203/45288* (2013.01)

(58) Field of Classification Search
USPC ........................................................ 324/509
See application file for complete search history.

(56) References Cited

U.S. PATENT DOCUMENTS

| | | | |
|---|---|---|---|
| 4,001,646 A | 1/1977 | Howell | |
| 4,012,668 A | 3/1977 | Wittlinger | |
| 4,021,729 A | 5/1977 | Hudson, Jr. | |
| 4,150,411 A | 4/1979 | Howell | |
| 4,378,579 A | 3/1983 | Hudson, Jr. | |
| 5,206,600 A | 4/1993 | Moehlmann | |
| 5,459,630 A | 10/1995 | MacKenzie et al. | |
| 5,508,607 A | 4/1996 | Gibson | |
| 5,515,001 A | 5/1996 | Vranish | |
| 5,600,524 A | 2/1997 | Neiger et al. | |
| 5,715,125 A | 2/1998 | Neiger et al. | |
| 5,808,574 A | 9/1998 | Johnson et al. | |
| 6,111,733 A | 8/2000 | Neiger et al. | |
| 6,259,996 B1 | 7/2001 | Haun et al. | |
| 6,421,214 B1 | 7/2002 | Packard et al. | |
| 6,426,632 B1 | 7/2002 | Clunn | |
| 6,618,648 B1 | 9/2003 | Shirota et al. | |
| 6,674,289 B2 | 1/2004 | Macbeth | |
| 6,807,035 B1 | 10/2004 | Baldwin et al. | |
| 6,807,036 B2 | 10/2004 | Baldwin | |
| 6,873,158 B2 | 3/2005 | Macbeth | |
| 6,946,828 B1 | 9/2005 | Layton | |
| 6,980,005 B2 | 12/2005 | Finlay, Sr. et al. | |
| 7,079,365 B2 | 7/2006 | Brown et al. | |
| 7,154,718 B1 | 12/2006 | Finlay, Sr. | |
| 7,253,629 B1 | 8/2007 | Richards et al. | |
| 7,323,934 B2 | 1/2008 | Huang | |
| 7,336,457 B2 | 2/2008 | Liscinsky, III | |
| 7,684,162 B2 | 3/2010 | Musat et al. | |
| 8,018,235 B2 | 9/2011 | Lewinski et al. | |
| 8,054,593 B2 | 11/2011 | Reid et al. | |
| 8,085,516 B1 | 12/2011 | Armstrong | |
| 8,217,644 B2 | 7/2012 | Younsi et al. | |
| 8,390,297 B2 * | 3/2013 | Beck ................... | G01R 27/18 324/509 |
| 9,086,400 B2 | 7/2015 | Minch et al. | |
| 9,124,094 B2 * | 9/2015 | Beck ................... | H02H 3/283 |
| 9,276,393 B2 * | 3/2016 | Ostrovsky ............ | H02H 1/0015 |
| 9,329,216 B2 * | 5/2016 | Beck ................... | G01R 27/18 |
| 9,330,875 B2 * | 5/2016 | Beck ................... | H01H 83/02 |
| 9,331,469 B2 * | 5/2016 | Beck ................... | H02H 3/162 |
| 9,411,003 B2 * | 8/2016 | Danesh ................ | G01R 19/00 |
| 9,478,969 B2 * | 10/2016 | Beck ................... | H02H 3/33 |
| 2003/0156367 A1 | 8/2003 | Macbeth | |
| 2005/0083616 A1 | 4/2005 | Reid et al. | |
| 2006/0125622 A1 | 6/2006 | Baldwin et al. | |
| 2008/0022153 A1 | 1/2008 | Wang et al. | |
| 2008/0106269 A1 | 5/2008 | Lewinski et al. | |
| 2010/0290164 A1 | 11/2010 | Kinsel | |
| 2011/0080177 A1 * | 4/2011 | Beck ................... | G01R 27/18 324/509 |
| 2011/0216452 A1 | 9/2011 | Haines et al. | |
| 2011/0221600 A1 | 9/2011 | Kinsel et al. | |
| 2013/0128396 A1 * | 5/2013 | Danesh ................ | G01R 19/00 361/45 |
| 2013/0214800 A1 * | 8/2013 | Beck ................... | G01R 27/18 324/691 |
| 2013/0215537 A1 * | 8/2013 | Beck ................... | H02H 3/162 361/42 |
| 2013/0229734 A1 * | 9/2013 | Beck ................... | H02H 3/162 361/42 |
| 2014/0092503 A1 * | 4/2014 | Ostrovsky ............ | H02H 1/0015 361/45 |
| 2014/0210484 A1 * | 7/2014 | Beck ................... | H02H 3/044 324/509 |
| 2014/0268435 A1 * | 9/2014 | Beck ................... | H02H 3/283 361/42 |
| 2016/0006234 A1 * | 1/2016 | Ostrovsky ............ | H02H 1/0015 361/86 |
| 2016/0233837 A1 * | 8/2016 | Beck ................... | H02H 3/162 |
| 2016/0238644 A1 * | 8/2016 | Beck ................... | G01R 27/18 |

OTHER PUBLICATIONS

McEachern, Alexander, A floating-window algorithm for detecting certain power line faults that disrupt sensitive electronic loads, IEEE Trans. on Inst. and Meas., vol. 39, No. 1, Feb. 1990, pp. 112-115.

Russell, Don et al., A digital signal processing algorithm for detecting arcing faults on power distribution feeders, IEEE Trans. on Power Delivery, vol. 4, No. 1, Jan. 1989, pp. 132-140.

* cited by examiner

GROUND FAULT CIRCUIT INTERRUPTER AND METHOD

The present patent application is a divisional application of prior U.S. patent application Ser. No. 13/829,366, filed on Mar. 14, 2013, by Riley D. Beck et al., titled "Ground Fault Circuit Interrupter and Method," which is a continuation-in-part application of prior U.S. patent application Ser. No. 12/572,870, filed on Oct. 2, 2009, now U.S. Pat. No. 8,390,297 issued Mar. 5, 2013 by Riley D. Beck et al., titled "Ground Fault Circuit Interrupter and Method," which applications are hereby incorporated by reference in their entirety, and priority thereto for common subject matter is hereby claimed.

BACKGROUND

The present invention relates, in general, to measurement systems and, more particularly, to the measurement systems for electrical signals.

Circuits for measuring or calculating electrical signals such as current, voltage, and power and circuits for measuring or calculating electrical parameters such as impedance, admittance, phase relationships are used in a variety of applications including impedance measurements, load detection and calibration, security systems, smart grids, sensor interfaces, automotive systems, self-test systems, etc. For example, circuits used for determining the impedance of a system may include a resistor placed in series with a load so that the current flowing through the resistor can be used to determine the current flowing through the load. Drawbacks with this technique are the reduction of the input voltage range, the consumption of large areas of semiconductor material to manufacture the circuits, frequency limitations of the circuit elements, and the need for highly accurate circuit elements.

In some applications it may be desirable to detect a ground fault condition. One technique for detecting this condition is to establish resonance in an inductor-resistor-capacitor network when it is exposed to a ground-to-neutral condition. Resonance may be established by delivering a pulse to a positive feedback system that includes an operational amplifier. Alternatively, a steady state stimulus can be delivered to the circuit, which is then monitored for significant changes in the waveform profile. Drawbacks with these techniques are that they are prone to temperature and manufacturing shifts which reduce the accuracy of detection.

Accordingly, it would be advantageous to have a circuit and method for determining electrical signals and electrical parameters of a circuit element. It would be of further advantage for the circuit and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
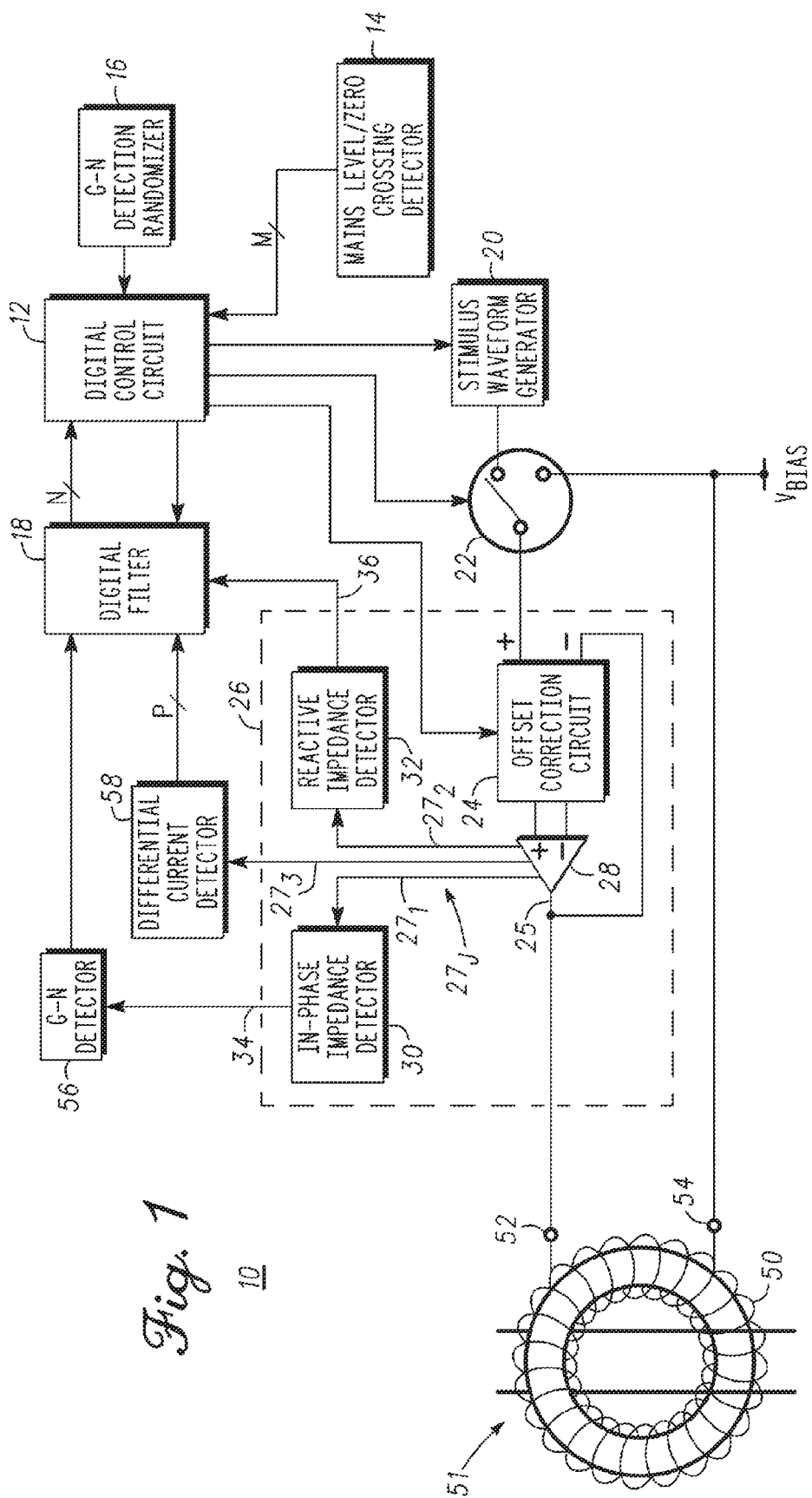
FIG. 1 is a block diagram of a measurement circuit in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten per cent (10%) (and up to twenty per cent (20%) for semiconductor doping concentrations) are regarded as reasonable variances from the ideal goal of exactly as described.

It should be noted that a logic zero voltage level ($V_L$) is also referred to as a logic low voltage or logic low voltage level and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Transistor-Transistor Logic (TTL) system a logic zero voltage level may be about 0.8 volts, whereas for a five volt CMOS system, the logic zero voltage level may be about 1.5 volts. A logic one voltage level ($V_H$) is also referred to as a logic high voltage level, a logic high voltage, or a logic one voltage and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

Generally, the present invention provides a Ground Fault Circuit Interrupter having various elements including an impedance measurement circuit. In accordance with embodiments of the present invention, an Operational Transconductance Amplifier (OTA) generates a plurality of output signals. For example, the OTA may generate a plurality of output currents where second, third, fourth, etc. currents are copies of a first current. Alternatively, the OTA may generate a plurality of output voltages where each output voltage of the plurality of output voltages is proportional to an output current of the OTA. When the OTA generates a plurality of output currents, they may be input to corresponding mixers as currents or they may be converted to output voltages which are input to corresponding mixers. A modulator may be used to modulate at least one of the current or voltage signals from the OTA by an in-phase signal resulting in a modulated signal that is filtered by a low pass filter to pass the baseband voltage of the mixed signal. Preferably, the in-phase signal is in phase with the input signal to the OTA. The output signal of the low pass filter is digitized by an analog-to-digital converter to determine multiple real impedance levels or by a comparator to determine a specific real impedance. In addition, a modulator may be used to modulate at least one of the current or voltage signals from the OTA by a phase shifted signal resulting in a modulated signal that is filtered by a low pass filter, where the modulated signal indicates the reactive impedance of the load. The reactive component is digitized by an analog-to-digital converter or a comparator. Preferably, the phase shifted signal is shifted by ninety degrees from the signal at the input terminal of the OTA.

In accordance with alternative embodiments, the circuit can be configured to measure just the in-phase impedance or just the quadrature impedance. In addition, a single modulator may be used to measure the in-phase impedance and the quadrature impedance by performing the measurements at different times.

In addition, embodiments of the present invention are suitable for use with GFCI circuits associated with single wound single current transformer circuits thereby forming a single wound single current transformer based impedance measurement circuit. An advantage of using single wound single current transformer circuits is that they are less expensive to implement.

Figure 2:
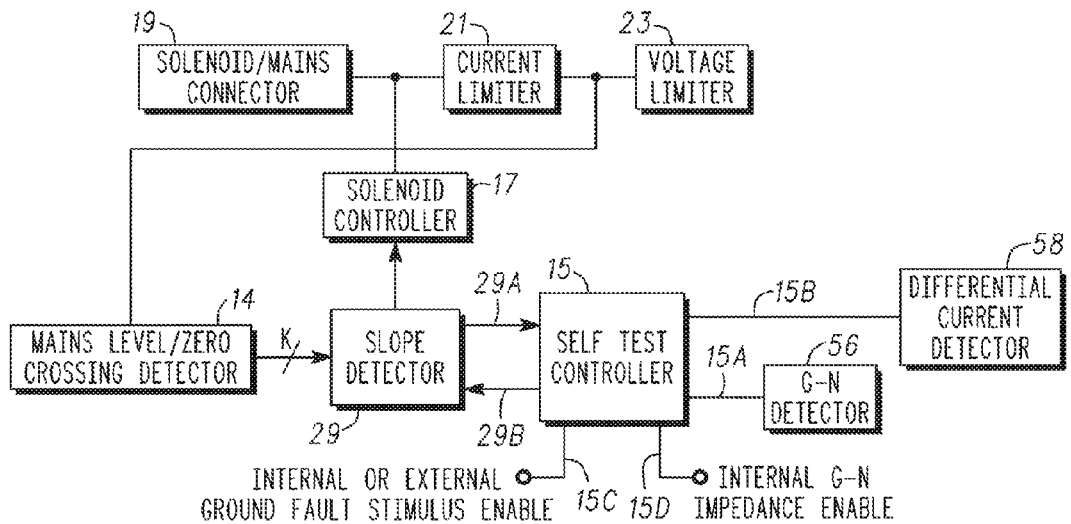
FIG. 2 is a block diagram of a portion of a measurement circuit in accordance with an embodiment of the present invention.
Figure 3:
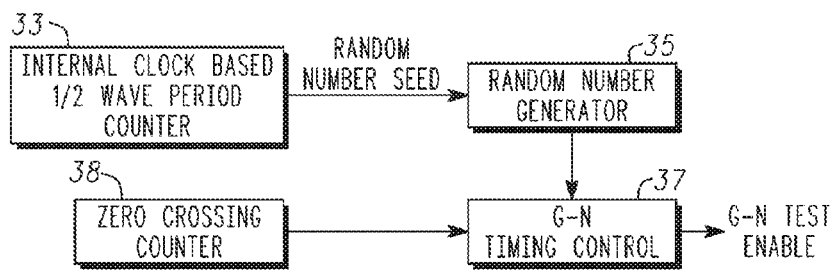
FIG. 3 is a block diagram of a circuit module for randomizing the timing of the ground-to-neutral measurements in accordance with embodiments of the present invention.

FIGS. 1, 2, and 3 are block diagrams of a Ground Fault Circuit Interrupter (GFCI) module 10 in accordance with an embodiment of the present invention. For the sake of clarity, FIGS. 1, 2, and 3 are described together. GFCI module 10 is comprised of a digital control circuit 12 coupled for receiving input signals from a mains level/zero crossing detector circuit 14, a ground-to-neutral (G-N) detection randomizer 16, and a digital filter 18. The signals received from digital filter 18 may be transmitted over a bus connection having N interconnects, where N is an integer and the signals received from mains level detector circuit 14 may be transmitted over a bus connection having M interconnects, where M is an integer. Integers N and M may be the same as each other or they may be different from each other. Digital control circuit 12 is coupled for transmitting signals to digital filter 18, to a stimulus waveform generator 20, to a switch 22, and to an offset correction circuit 24. Although filter 18 is described as a digital filter, this is not a limitation of the present invention. Filter 18 may be an analog filter.

In accordance with an embodiment, mains level/zero crossing detector circuit 14 is connected to a slope detector 29 through a bus connection having K interconnects, where K is an integer. Slope detector 29 is connected to a self test controller 15 through connections 29A and 29B, where a slope detect fault signal (SD_FAULT) is transmitted to self test controller 15 through connection 29A and a slope detect enable signal (SD_EN) is received from self test controller 15 through connection 29B. Slope detector 29 is connected to a solenoid controller 17, which is connected to a solenoid or the mains through a solenoid/mains connector 19. The connection between slope detector 29 and solenoid controller 17 transmits a solenoid enable signal (SOL_EN) to solenoid controller 17. Self test controller 15 is connected to G-N detector 56 through an output terminal 15A and to differential current detector 58 through an output terminal 15B. In addition, self test controller 15 has an output terminal 15C through which an internal or external ground fault stimulus enable signal is transmitted and an output terminal 15D through which an internal G-N impedance enable signal is transmitted. Alternatively, slope detector 29 may be omitted in which case mains level/zero crossing detector circuit 14 is connected to self test controller 15 through the bus connection having the K interconnects. In this embodiment, self test controller 15 is connected to solenoid controller 17. Mains level/zero crossing detector 14 is connected to solenoid/mains connector 19 through a current limiter 21 and to a voltage limiter 23.

The input terminal of mains/line level detector circuit 14 is connected to the power mains or line level of the circuit being monitored by GFCI module 10. It may be connected through a protection structure such as, for example, current limiter 21 shown in FIG. 2. By way of example, current limiter 21 is a resistor. Mains level detector circuit 14 communicates the mains level to digital control circuit 12 and is capable of indicating when the mains level is crossing neutral during a polarity transition or it can indicate when other levels are being used. During a self test, mains level detector circuit 14 can indicate when it is safe for digital control circuit 12 to activate an external device such as, for example, a Silicon Controlled Rectifier (SCR) to test a GFCI solenoid. In addition, mains level detector circuit 14 can be used to determine if the external device is working properly by monitoring the effect of tripping the external device on the mains voltage level. For example, digital control circuit 12 may activate an external transistor or SCR to pull current through an external solenoid. As current is pulled through the transistor or the SCR, the mains voltage decreases or droops at a different rate from that of steady state operation, i.e., there is a change in the slope of mains voltage. The rate at which the mains voltage decreases can be measured by mains level detector circuit 14 to determine if the external device is working properly. Introducing a small change in the slope increases the window after a zero crossing during which the circuit can be tested and indicates when the SCR can be activated. Thus, level detector circuit 14 generates an operating condition signal in accordance with the rate at which the mains voltage level decreases that indicates if the circuit is working properly or if it is safe for digital control circuit 12 to activate an external device.

Figure 4:
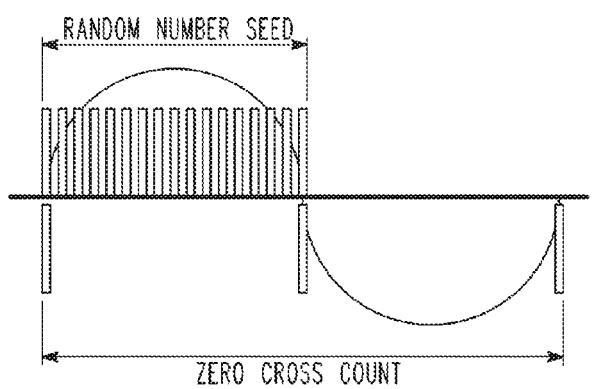
FIG. 4 is a waveform for randomizing the timing of the ground-to-neutral measurements in accordance with embodiments of the present invention.

Ground-to-neutral detection randomizer 16 is used to determine when GFCI module 10 should check for a ground-to-neutral fault. If multiple GFCI modules 10 are used on the same mains circuit, one GFCI module 10 may corrupt another GFCI module 10 if they operate the ground-to-neutral measurements at the same time. Therefore, it is advantageous to randomize the timing of the ground-to-neutral measurements. G-N detection randomizer 16 randomizes the timing between ground-to-neutral measurements to minimize the likelihood of corrupting them. FIG. 3 is a block diagram of a circuit module 31 for randomizing the timing of the ground-to-neutral measurements. An internal clock based half-wave period counter 33 is connected for transmitting a random number seed to a random number generator 35, which is connected for transmitting the random number generation signal to a G-N timing control circuit 37. In addition, G-N timing control circuit 37 is connected for receiving a zero-crossing count signal from a zero-crossing counter 38 and generates a G-N test enable signal. G-N timing control circuit 37 may be a sub-module within G-N detection randomizer 16. The randomization may be based on the number of oscillations of a clock in a given period of the mains cycle as illustrated in FIG. 4. What is shown in FIG. 4 is a plot 41 illustrating the mains cycle having three zero crossings and a random number seed based on a counter that counts during a half period of the mains cycle.

Offset correction circuit 24 is used to minimize the effective offset of an Operational Transconductance Amplifier (OTA) 28. If a DC blocking capacitor is not used in series with current transformer 51, an offset voltage in OTA 28 will produce a DC current through current transformer 51. The DC current will affect the accuracy of the differential current measurements by differential current detector circuit 58. Offset correction detector 24 removes the offset of OTA 28 and preserves the accuracy of the differential current measurements. Another reason this is advantageous is that it allows current transformer 51 to be implemented with fewer windings.

GFCI module 10 further includes a circuit element parameter measurement network 26 that is comprised of offset correction circuit 24, operational transconductance amplifier (OTA) 28, an in-phase impedance detector 30, and a reactive impedance detector 32. By way of example circuit element parameter measurement network 26 is an impedance measurement network, i.e., the circuit element parameter measured by network 26 is impedance. An inverting input terminal of offset correction circuit 24 is commonly connected to an output terminal 25 of OTA 28 and to a terminal 52 of the primary windings 50 of a current transformer 51 and a non-inverting input terminal of offset correction circuit 24 is connected to a terminal of switch 22. Output terminals of offset correction circuit 24 are connected to corresponding input terminals of OTA 28. More particularly, an output terminal of offset correction circuit 24 is connected to the inverting input terminal of OTA 28 and another output terminal of offset correction circuit 24 is connected to a non-inverting input terminal of OTA 28. A control terminal of switch 22 is coupled for receiving a control signal from digital control circuit 12 and another terminal of switch 22 is coupled for receiving a bias voltage $V_{BIAS}$ and to a terminal 54 of primary windings 50.

An output terminal 34 of in-phase impedance detector 30 is connected to a ground-neutral (G-N) detector 56 and an output terminal 36 of reactive impedance detector 32 is connected to digital filter 18. Output terminals 34 and 36 serve as output terminals of circuit element parameter measurement network 26. An output terminal $27_J$ of OTA 28 is connected to an input terminal of differential current detector 58 and an output terminal of differential current detector 58 may be connected to an input terminal of digital filter 18 over a bus connection having P interconnects, where P is an integer. It should be noted that reference character "J" represents an integer and has been appended to reference character 27 to indicate that one or more output terminals, e.g., output terminals $27_1$, $27_2$, $27_3$, etc., may extend from OTA 28. In embodiments in which the electrical signal that is output from OTA 28 is current, it is preferable that each of in-phase impedance detector 30, reactive impedance detector 32, and differential current detector 58 be connected to its own output terminal from OTA 28. For example, when the output signal of OTA 28 is a current, an output terminal $27_1$ is connected to in-phase impedance detector 30, an output terminal $27_2$ is connected to reactive impedance detector 32, and an output terminal $27_3$ is connected to differential current detector 58.

GFCI module 10 includes sub-modules that are capable of performing an impedance measurement, including a ground-to-neutral resistance measurement and a current transformer reactive impedance measurement, i.e., a self test; a differential current measurement level detection; an OTA offset correction; a ground-to-neutral level detection; a mains/line voltage level detection; stimulus generation; ground-to-neutral detection randomization; digital fault filtering; or the like.

In accordance with embodiments in which impedance is being measured, waveform stimulus generator 20 creates an electrical signal or waveform that is transmitted to the non-inverting input terminal of offset correction circuit 24 through switch 22. It should be noted that waveform stimulus generator 20 may generate a waveform having a single frequency or a plurality of waveforms having different frequencies from each other. By way of example, to determine whether a true fault has occurred waveform stimulus generator 20 may generate three waveforms each having a different frequency. GFCI 10 includes a voting algorithm to determine when a fault occurs. More particularly, GFCI 10 determines that a fault has occurred based on a majority of the waveform frequencies, e.g., if a fault condition is detected using two out of three of the waveforms, then GFCI 10 indicates the occurrence of a fault. This type of algorithm protects against false trips that may occur if there is a perfectly aligned noise signal on the system.

Offset correction circuit 24 transmits the electrical signal to the non-inverting input terminal of OTA 28. Because OTA 28 is configured as a follower, the electrical signal at its output terminal 25 follows the electrical signal at its non-inverting input terminal. Thus, the electrical signal appearing at the non-inverting input terminal of OTA 28 is transmitted to output terminal 25 and to input terminal 52 of current transformer 51. Input terminal 54 of current transformer 51 is coupled for receiving a bias voltage $V_{BIAS}$. OTA 28 creates an electrical signal that is proportional to the electrical signal that appears at output terminal 25 and transmits the proportional electrical signal from output terminals $27_J$ to in-phase impedance detector 30, quadrature or reactive impedance detector 32, and differential current detector 58. It should be noted that the reference character "J" has been appended to reference character 27 to indicate that one or more output terminals may extend from OTA 28 and provide copies of the current that appears at output terminal 25. As discussed above, when the electrical signal that is output from OTA 28 is current, it is preferable to have output terminals $27_1$, $27_2$, and $27_3$ extending from OTA 28 to in-phase impedance detector 30, reactive impedance detector 32, and differential current detector 58, respectively. Alternatively, output terminals $27_1$, $27_2$, and $27_3$ may be replaced by a single output terminal that is connected to a switch (not shown) that switches the current from the single output terminal between in-phase impedance detector 30, reactive impedance detector 32, and differential current detector 58.

In-phase impedance detector 30 detects the real component or portion of the impedance of the current transformer load for current transformer 51 and transmits a current or voltage signal to G-N detector 56 that is proportional to this component or portion of the impedance of current transformer 51. G-N detector 56 determines whether the impedance should cause a fault. Reactive or quadrature impedance detector 32 detects the reactive component or portion of the impedance of the current transformer load for current transformer 51 and transmits a current or voltage signal to digital filter 18 that is proportional to this component or a portion of the impedance of current transformer 51. Digital filter 18 determines whether the reactive component is within an acceptable range. For example, a reactive impedance that is too low may indicate that the current transformer is not properly connected to network 26.

Figure 5:
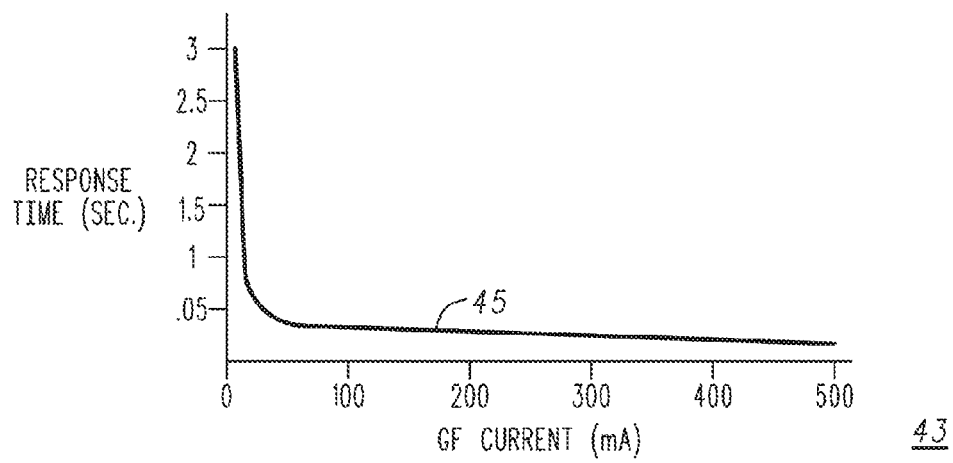
FIG. 5 is a timing diagram for a portion of the circuit module of FIG. 1.
Figure 6:
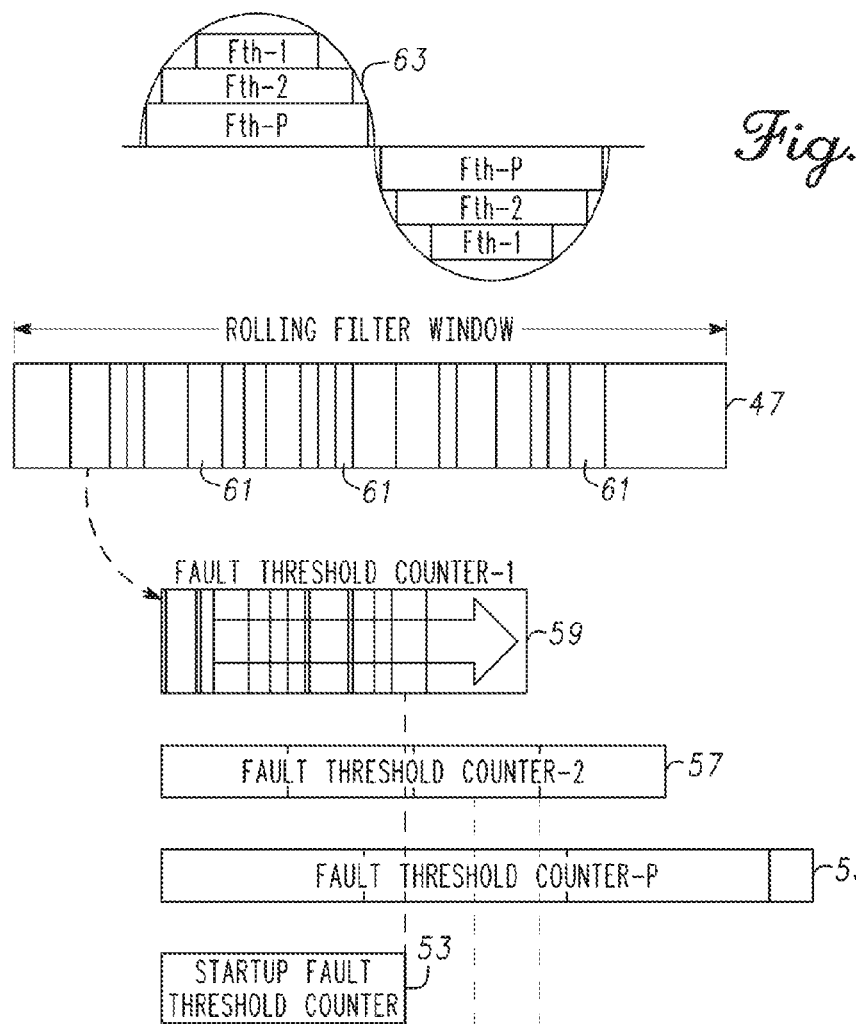
FIG. 6 illustrates a threshold diagram for a portion of the circuit module of FIG. 1.

In accordance with an embodiment, differential current measurement may be accomplished by operating switch 22 such that the non-inverting input terminal of offset correction circuit 24 is connected to bias voltage $V_{BIAS}$. The electrical signal at output terminal 25 is driven to voltage $V_{BIAS}$ by the feedback configuration of OTA 28. In this configuration input terminals 52 and 54 of current transformer 51 are driven to the voltage level $V_{BIAS}$. Any differential current through the secondary windings of current transformer 51 will induce a current through the primary windings of current transformer 51. The induced current is supplied to output terminal 25 to maintain the voltage at output terminal 25 at the voltage $V_{BIAS}$. OTA 28 creates or generates a copy of the induced current that is proportional to the induced current at output terminal $27_3$, which is transmitted to the input terminal of differential current detector 58. Differential current detector 58 generates an output current that is transmitted to digital filter 18, which determines whether a differential current fault has occurred based on the differential current levels, and the amount of time that the current levels exist. The filter timing of digital filter 18 may be adjusted dynamically based on the conditions of circuit 10. For example, on initial startup it may be advantageous to minimize the filter timing to quickly catch a wiring fault. However, during normal operation it may be advantageous to increase the filter timing to minimize the effects of noise on the mains line. FIGS. 5 and 6 illustrate the timing of digital filter 18 in accordance with an embodiment of the present invention. FIG. 5 is a timing diagram 43 showing a plot 45 of the relationship between a differential fault current and the time allowed for GFCI module 10 to respond to the fault by opening up the electrical contacts. FIG. 6 illustrates rolling windows for each piecewise linear segment of the differential current that is monitored. More particularly, digital filter 18 is capable of monitoring several states in which GFCI module 10 may be operating. Each state is associated with a different threshold level for identification of a ground fault. During the startup state or phase, a startup fault threshold counter that may be a sub-module within digital filter 18 is programmed to have a startup fault threshold count. During steady state or a steady state phase of operation, digital filter 18 may have a fault threshold counter programmed to have a steady state fault threshold count that is different and preferably higher than the startup fault threshold count during the startup state or phase. It should be noted that the fault threshold counters may be timers such that when a fault exceeds fault threshold for a predetermined period of time, a wiring fault has occurred. The number of states is not limited to being a startup state and steady state. For instance, GFCI module 10 may be operating in a state or phase that is determined by environmental or external conditions. By way of example, GFCI module 10 may be operating in a non-ideal environmental condition such as a brownout condition, i.e., an insufficient power supply voltage, or during a negative half wave, or module 10 may be operating in a condition in which it is undesirable to maintain power to a portion of the circuitry, e.g., the analog portion of the circuitry. Thus, the portion of the circuitry may be powered down. When the brownout condition is over or the portion of the circuitry that was powered down is powered back up, a portion of the output signal from digital filter 18 may be lost. Accordingly, it may be desirable to begin GFCI module 10 so that digital filter 18 is in the startup state, i.e., programmed to have the startup fault threshold count, or digital filter 18 may be programmed to have a fault threshold count that is lower than the startup fault threshold count, lower than the steady state fault threshold count, between the startup fault threshold count and the steady state fault threshold count, or greater than the steady state fault threshold count to meet a specified set of timing requirements. Accordingly, there can be one state, two states, three states, four states, or more states. In addition, the steady state may be comprised of one or more states depending on the circuit configurations and external conditions.

Although the fault threshold counts have been described as being as comprising a fixed number of counts to trigger a fault, this is not a limitation of the present invention. Alternatively, the fault threshold can be based on a ratio-metric value. For example, the fault threshold may be a ratio of the count of the over-threshold counter to the count of the half wave period counter or the count of the over-threshold counter to the frequency of the mains. An advantage of using a ratio-metric approach is that it provides immunity to AC source variation.

FIG. 6 illustrates a rolling time window 47 over which a linear segment of plot 45 is monitored for a differential fault current. By way of example, digital filter 18 has four fault threshold counters 53, 55, 57, and 59. However, this is not a limitation of the present invention. There may be P fault threshold counters, where P is an integer. Fault threshold counter 53 is a startup threshold counter. A fault creates fault pulses 61 in rolling time window 47 that have different magnitudes, different pulse widths, and different pulse thresholds. The pulses have different widths for each value of a fault impedance. FIG. 6 also illustrates a fault current waveform 63 with fault threshold count or timing levels Fth-1, Fth-2, . . . , Fth-P. When a minimum threshold of fault time or fault count has been reached, GFCI module 10 indicates that a fault has occurred, i.e., if fault time or count exceeds the fault threshold for a first period of time or number of counts, a wiring fault has occurred. Digital filter 18 monitors GFCI module 10 for a predetermined minimum period of time and if no fault pulse is detected then GFCI module 10 continues in the normal mode of operation. If a fault pulse is detected, GFCI module 10 measures the duration and intensity of the pulse and generates an operating condition signal in accordance with the rate at which the mains level voltage decreases.

Although the electrical signal generated by OTA 28 and transmitted to differential current detector 58 has been described as a current, this is not a limitation of the present invention. Alternatively, the electrical signal transmitted from OTA 28 may be a voltage that is proportional to the induced current.

FIGS. 7-14 illustrate embodiments of circuit element parameter measurement networks that are included in GFCI module 10. The circuit element parameter measurement networks of FIGS. 7-14 measure impedances. However, it should be understood this is not a limitation of the present invention. When GFCI module 10 measures impedance and is coupled to a single wound single current transformer, it is referred to as a single wound single current transformer impedance measurement circuit.

Figure 7:
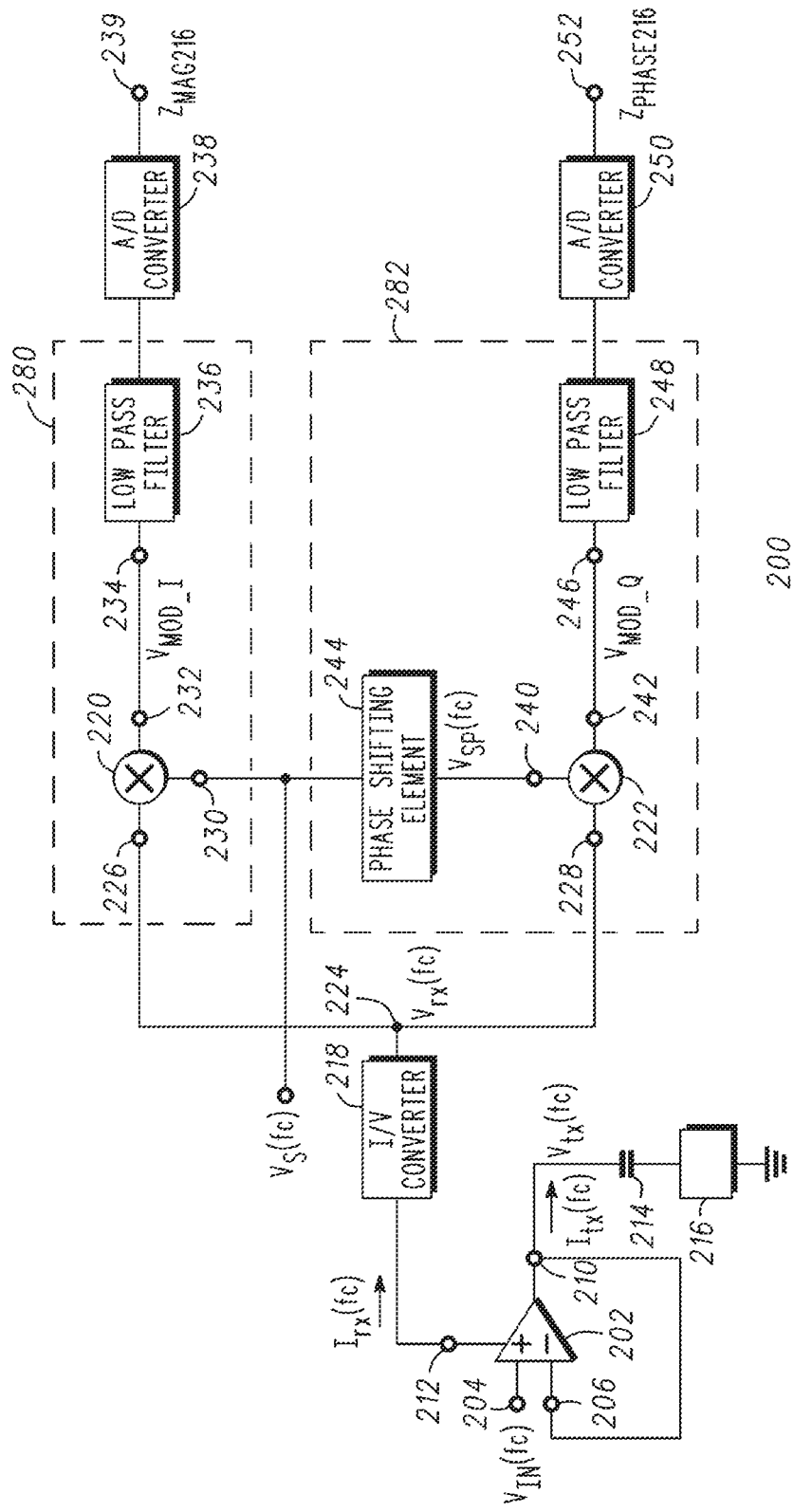
FIG. 7 is a schematic diagram of a measurement circuit in accordance with another embodiment of the present invention.

FIG. 7 is a block diagram of a circuit element parameter measurement network 200 in accordance with an embodiment of the present invention. What is shown in FIG. 7 is an Operational Transconductance Amplifier (OTA) 202 having a non-inverting input terminal 204, an inverting input terminal 206, and output terminals 210 and 212. It should be noted that OTA 202 is analogous to OTA 28 shown and described with reference to FIG. 1. Non-inverting input terminal 204 is coupled for receiving an electrical signal $V_{IN}(fc)$ having a frequency fc and inverting input terminal 206 is connected to output terminal 210. Preferably, electrical input signal $V_{IN}(fc)$ is a voltage signal. More preferably, electrical signal $V_{IN}(fc)$ is a periodic voltage signal such as, for example, a sine wave. It should be noted that electrical signal $V_{IN}(fc)$ may be a DC signal, i.e., frequency fc equals zero. Output terminal 210 of OTA 202 is coupled to a load 216 through a capacitor 214. By way of example, load 216 is a load impedance that has a circuit element parameter having a real component and a reactive component. For example, when load 216 is an impedance, the impedance has a magnitude and a phase. It should be noted capacitor 214 is an optional circuit element that may be omitted.

Output terminal 212 of OTA 202 is coupled to modulators 220 and 222 through a current to voltage (I/V) converter 218. An input terminal 226 of modulator 220 and an input terminal 228 of modulator 222 are connected to an output terminal of I/V converter 218 to form a node 224. By way of example, I/V converter 218 may be a resistor through which current $I_{rx}(fc)$ flows generating a voltage $V_{rx}(fc)$.

Modulator 220 also has an input terminal 230 coupled for receiving a modulation signal $V_S(fc)$ and an output terminal 232 that is connected to an input terminal 234 of a Low Pass Filter (LPF) 236. Modulation signal $V_S(fc)$ may be a periodic signal such as, for example, a sine wave, a square wave, a saw tooth wave, etc. It should be noted that modulation signal $V_S(fc)$ is the same type of signal as input signal $V_{IN}(fc)$ and has the same frequency as input signal $V_{IN}(fc)$. Preferably, modulation signal $V_S(fc)$ is a sine wave. An Analog-to-Digital Converter (ADC) 238 is connected to an output terminal of LPF 236. An output signal $Z_{MAG216}$ appears at an output terminal 239 of ADC 238. Modulator 220 and LPF 236 form an in-phase or real impedance detector 280.

Modulator 222 has an input terminal 240 coupled for receiving a modulation signal $V_{SP}(fc)$ through a phase shifting element 244, and an output terminal 242 coupled to an input terminal 246 of an LPF 248. Phase shifting element 244 shifts the phase of modulation signal $V_S(fc)$ to produce a phase shifted modulation signal $V_{SP}(fc)$ that has the same frequency and amplitude as modulation signal $V_S(fc)$, but a different phase. For example, signals $V_S(fc)$ and $V_{SP}(fc)$ may have a phase difference of ninety degrees, e.g., signal $V_{SP}(fc)$ is ninety degrees out of phase from signal $V_S(fc)$. An ADC 250 is connected to an output terminal of LPF 248. An output signal $Z_{PHASE216}$ appears at an output terminal 252 of ADC 250. Modulator 222 and LPF 248 form a quadrature impedance detector 282. Quadrature impedance detector 282 is also referred to as an imaginary impedance detector or a reactive impedance detector.

In operation, input voltage $V_{IN}(fc)$ is applied at input terminal 204 of OTA 202. In response to input voltage $V_{IN}(fc)$, OTA 202 generates a current $I_{rx}(fc)$ that flows from output terminal 210 through capacitor 214 and into load 216 thereby generating a voltage $V_{rx}(fc)$ at output terminal 210. Because output terminal 210 is connected to input terminal 206, voltage $V_{rx}(fc)$ appears at input terminal 206. Thus, OTA 202 buffers input signal $V_{IN}(fc)$ to load 216. In addition, OTA 202 generates a copy of current $I_{rx}(fc)$ and conducts this current through output terminal 212. The copy of current $I_{rx}(fc)$ is labeled current $I_{rx}(fc)$ and is referred to as a copy current or a copied current. Current $I_{rx}(fc)$ is transmitted to I/V converter 218, which generates a voltage $V_{rx}(fc)$ at node 224.

In response to voltages $V_{rx}(fc)$ and $V_s(fc)$, modulator 220 generates an output voltage $V_{MOD\_I}$ at output terminal 232. Output voltage $V_{MOD\_I}$ is equivalent to the magnitude or the real portion of current $I_{rx}(fc)$ shifted down to the baseband, i.e., shifted down to DC. LPF 236 filters output voltage $V_{MOD\_I}$ to remove any high frequency noise and ADC 238 digitizes the filtered output voltage $V_{MOD\_I}$ to form a digital code $Z_{MAG216}$ that represents the magnitude of the impedance of load 216, i.e., the digitized signal represents the magnitude of the in-phase component of the impedance of load 216.

In response to voltages $V_{rx}(fc)$ and $V_{SP}(fc)$, modulator 222 generates an output voltage $V_{MOD\_Q}$ at output terminal 242. LPF 248 filters output voltage $V_{MOD\_Q}$ to remove any high frequency noise and ADC 250 digitizes the filtered output voltage $V_{MOD\_Q}$ to form a digital code $Z_{PHASE216}$ that represents the phase of the impedance of load 216, i.e., the digitized signal represents the quadrature component of the impedance of load 216.

Figure 8:
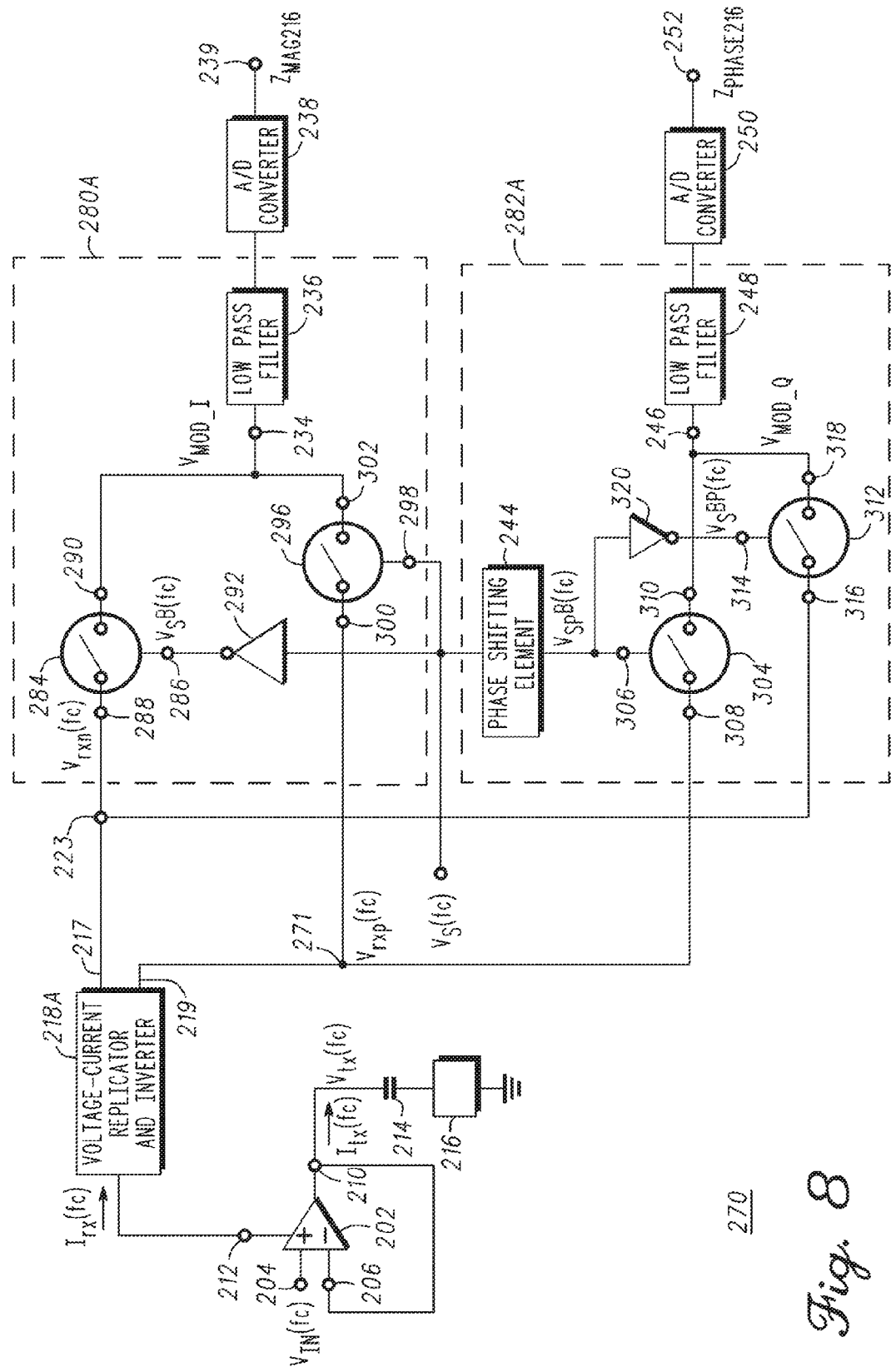
FIG. 8 is a schematic diagram of a measurement circuit in accordance with another embodiment of the present invention.

FIG. 8 is a schematic diagram of a circuit element parameter measurement network 270 in accordance with another embodiment of the present invention. Network 270 includes OTA 202, capacitor 214, load 216, LPF's 236 and 248, and ADC's 238 and 250 which have been described above with reference to FIG. 2. In addition, network 270 includes a voltage/current replicator and inverter block 218A which has an output terminal 217 commonly connected to input terminal 288 of switch 284 and to input terminal 316 of switch 312 to form a node 223 and an output terminal 219 commonly connected to terminal 300 of switch 296 and to terminal 308 of switch 304 to form a node 271. Network 270 further includes a switch 284 which has a control terminal 286, a terminal 288 connected to node 223, and a terminal 290 connected to input terminal 234 of LPF 236. Control terminal 286 is coupled for receiving modulation signal $V_S B(fc)$ through an inverter 292, i.e., an input terminal of inverter 292 is coupled for receiving modulation signal $V_S(fc)$ and an output terminal of inverter 292 is connected to control terminal 286 of switch 284 for transmitting inverted modulation signal $V_S B(fc)$. Node 271 is coupled to input terminal 234 of LPF 236 through a switch 296, which has a control terminal 298 and terminals 300 and 302. Control terminal 298 is coupled for receiving modulation signal $V_S(fc)$, terminal 300 is connected to node 271, and terminal 302 is connected to input terminal 234 of LPF 236.

In addition, node 271 is coupled to input terminal 246 of LPF 248 through a switch 304, which has a control terminal 306 and terminals 308 and 310. More specifically, control terminal 306 is coupled for receiving modulation signal $V_{SP}(fc)$, terminal 308 is connected to node 271, and terminal 310 is connected to input terminal 246 of LPF 248. Switch 312 has a control terminal 314 coupled for receiving modulation signal $V_{SP} B(fc)$ from an inverter 320, a terminal 316 commonly connected to terminal 288 of switch 284, and to terminal 217 of current-to-voltage converter 218A, and a terminal 318 commonly connected to input terminal 246 of LPF 248 and to terminal 310 of switch 304.

In operation, input signal $V_{IN}(fc)$ is received at input terminal 204 of OTA 202. In response to input signal $V_{IN}(fc)$, OTA 202 generates a current $I_{tx}(fc)$ that flows from output terminal 210 through capacitor 214 and into load 216 thereby generating a voltage $V_{tx}(fc)$ at output terminal 210. Because output terminal 210 is connected to input terminal 206, voltage V(fc) appears at input terminal 206. Thus, OTA 202 buffers input signal $V_{IN}(fc)$ to load 216. In addition, OTA 202 generates a copy of current $I_{tx}(fc)$ and conducts this current through output terminal 212. The copy of current $I_{tx}(fc)$ is labeled current $I_{rx}(fc)$ and is referred to as a copy current or a copied current. Current $I_{rx}(fc)$ is transmitted to I/V converter 218A and is converted to a voltage $V_{rxp}(fc)$ which appears at node 271 and a voltage $V_{rxn}(fc)$ that appears at node 223.

It should be noted that modulation signal $V_S(fc)$ controls switches 284 and 296 and modulation signal $V_{SP}(fc)$ controls switches 304 and 312. When modulation signal $V_S(fc)$ is at a logic high voltage level switch 284 is closed and switch 296 is open and when modulation signal $V_S(fc)$ is at a logic low voltage level switch 284 is open and switch 296 is closed. When modulation signal $V_{SP}(fc)$ is at a logic high voltage level switch 304 is closed and switch 312 is open and when modulation signal $V_{SP}(fc)$ is at a logic low voltage level switch 304 is open and switch 312 is closed. Thus, switches 284 and 296 are opened and closed to multiply signals $V_{rxn}(fc)$ and $V_S B(fc)$ with each other and to multiply signals $V_{rxp}(fc)$ and $V_S(fc)$ with each other. The multiplication of these signals forms product signals that are combined to form voltage signal $V_{MOD\_I}$ at input terminal 234 of LPF 236. Output voltage $V_{MOD\_I}$ is equivalent to the magnitude or the real portion of current $I_{tx}(fc)$ shifted down to the baseband, i.e., shifted down to DC. Because signals $V_{rxn}(fc)$ and $V_{rxp}(fc)$ are fully differential signals, the DC component of input signal $V_{IN}(fc)$ is removed, thereby increasing the noise immunity of network 270. LPF 236 filters output voltage $V_{MOD\_I}$ to remove any high frequency noise and ADC 238 digitizes filtered output voltage $V_{MOD\_I}$ to form a digital code $Z_{MAG216}$ that represents the magnitude of the impedance of load 216, i.e., the digitized signal represents the magnitude of the in-phase component of the impedance of load 216. Switches 284 and 296, inverter 292, and LPF 236 form an in-phase or real impedance detector 280A.

Similarly, switches 304 and 312 are opened and closed to multiply signals $V_{rxn}(fc)$ and $V_{SP} B(fc)$ with each other and to multiply signals $V_{rxp}(fc)$ and $V_{SP}(fc)$ with each other. The multiplication of these signals forms product signals that are combined to form voltage signal $V_{MOD\_Q}$ at input terminal 246 of LPF 248. LPF 248 filters output voltage $V_{MOD\_Q}$ to remove any high frequency noise and ADC 250 digitizes filtered output voltage $V_{MOD\_Q}$ to form a digital code $Z_{PHASE216}$ that represents the phase of the impedance of load 216, i.e., the digitized signal represents the quadrature component of the impedance of load 216. Switches 304 and 312, inverter 320, phase shifting element 244, and LPF 248 form a quadrature impedance detector 282A. Quadrature impedance detector 282A is also referred to as an imaginary impedance detector or a reactive impedance detector.

Figure 9:
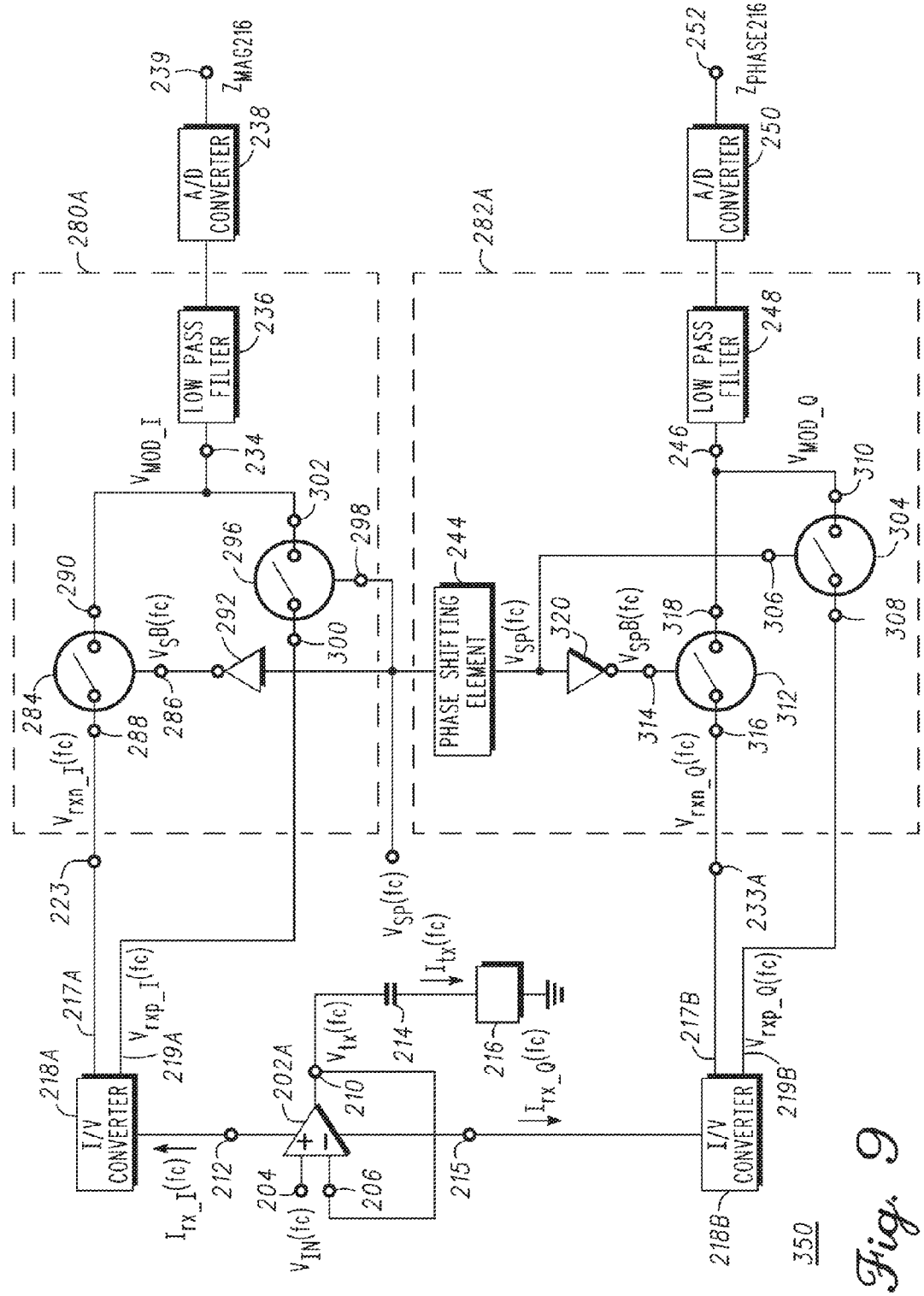
FIG. 9 is a schematic diagram of a measurement circuit in accordance with another embodiment of the present invention.

FIG. 9 is a schematic diagram of a circuit element parameter measurement network 350 in accordance with another embodiment of the present invention. What is shown in FIG. 9 is OTA 202A coupled to load 216 through capacitor 214. OTA 202A is similar to OTA 202 but has three output terminals 210, 212, and 215 rather than the two output terminals 210 and 212 of OTA 202. Because OTA 202A has three output terminals, reference character "A" has been appended to reference character "202" to distinguish between OTA 202 of FIG. 2 and the operational transconductance amplifier of FIG. 8. Similar to network 270 described with reference to FIG. 7, output 210 of OTA 202A is coupled to load 216 through capacitor 214. Network 350 includes node 223 coupled to input terminal 234 of LPF 236 through a switch 284 and to an output terminal 217A of current-to-voltage converter 218A. More particularly, switch 284 has a control terminal 286, a terminal 288 connected to node 223, and a terminal 290 connected to input terminal 234 of LPF 236. Control terminal 286 is coupled for receiving modulation signal $V_S B(fc)$ from an inverter 292, i.e., an input terminal of inverter 292 is coupled for receiving modulation signal $V_S(fc)$ and an output terminal of inverter 292 is connected to control terminal 286 of switch 284 for transmitting an inverter modulation signal $V_S B(fc)$. Input terminal 234 of LPF 236 is coupled to output terminal 219A of current-to-voltage converter 218A through a switch 296, which has a control terminal 298 and terminals 300 and 302. Control terminal 298 is coupled for receiving modulation signal $V_S(fc)$, terminal 300 is connected to output terminal 219A of current-to-voltage converter 218A, and terminal 302 is commonly connected to input terminal 234 of LPF 236 and to terminal 290 of switch 284.

Output terminal 215 of OTA 202A is coupled to LPF 248 through a switch 312 and a current-to-voltage converter 218B. More particularly, output terminal 215 is connected to an input terminal of current-to-voltage converter 218B and an output terminal 217B of current-to-voltage converter 218B is connected to terminal 316 to form a node 223A. An output terminal 219B of current-to-voltage converter 218B is connected to a terminal 308 of switch 304. Switch 304 also has a control terminal 306 coupled for receiving modulation signal $V_{SP}(fc)$ and a terminal 310 commonly connected to input terminal 246 of LPF 248 and to a terminal 318 of switch 312. Output terminal 217B is coupled to input terminal 246 of LPF 248 and to terminal 310 of switch 304 through switch 312. More particularly, switch 312 has a control terminal 314, a terminal 316 connected to output terminal 217B, and a terminal 318 commonly connected to input terminal 246 of LPF 248 and to terminal 310 of switch 304. Control terminal 314 is coupled for receiving modulation signal $V_{SP}B(fc)$ from inverter 320, i.e., an input terminal of inverter 320 is coupled for receiving modulation signal $V_{SP}(fc)$ and an output terminal of inverter 320 is connected to terminal 314 of switch 312 for transmitting inverted modulation signal $V_{SP}B(fc)$.

In operation, input voltage $V_{IN}(fc)$ is applied at input terminal 204 of OTA 202A. In response to input voltage $V_{IN}(fc)$, OTA 202A generates a current $I_{tx}(fc)$ that flows from output terminal 210 through capacitor 214 and into load 216 thereby generating a voltage $V_{tx}(fc)$ at output terminal 210. Because output terminal 210 is connected to input terminal 206, voltage $V_{tx}(fc)$ appears at input terminal 206. Thus, OTA 202A buffers input signal $V_{IN}(fc)$ to load 216. In addition, OTA 202 generates copies $I_{rx\_I}(fc)$ and $I_{rx\_Q}(fc)$ of current $I_{tx}(fc)$ and conducts the currents $I_{rx\_I}(fc)$ and $I_{rx\_Q}(fc)$ through output terminals 212 and 215, respectively. The copies of current $I_{tx}(fc)$ are labeled $I_{rx\_I}(fc)$ and $I_{rx\_Q}(fc)$ and each current is referred to as a copy current or a copied current. Current $I_{rx\_I}(fc)$ is transmitted to current-to-voltage converter 218A which generates a voltage signal $V_{rxp\_I}(fc)$ at node 223. Current $I_{rx\_Q}(fc)$ is transmitted to current-to-voltage converter 218B which generates a voltage signal $V_{rxp\_Q}(fc)$ at node 223A.

It should be noted that modulation signal $V_S(fc)$ controls switches 284 and 296 and modulation signal $V_{SP}(fc)$ controls switches 304 and 312. When modulation signal $V_S(fc)$ is at a logic high voltage level switch 284 is closed and switch 296 is open and when modulation signal $V_S(fc)$ is at a logic low voltage level switch 284 is open and switch 296 is closed. When modulation signal $V_{SP}(fc)$ is at a logic high voltage level switch 304 is closed and switch 312 is open and when modulation signal $V_{SP}(fc)$ is at a logic low voltage level switch 304 is open and switch 312 is closed. Thus, switches 284 and 296 are opened and closed to multiply signals $V_{rxp\_I}(fc)$ and inverted signal $V_SB(fc)$ with each other and to multiply signal $V_{rxp\_I}(fc)$ and $V_S(fc)$ with each other. The multiplication of these signals forms product signals that are combined to form voltage signal $V_{MOD\_I}$ at input terminal 234 of LPF 236. Output voltage $V_{MOD\_I}$ is equivalent to the magnitude or the real portion of current $I_{tx}(fc)$ shifted down to the baseband, i.e., shifted down to DC. Because signals $V_{rxn\_I}(fc)$ and $V_{rxp\_I}(fc)$ are fully differential signals, the DC component of input signal $V_{IN}(fc)$ is removed, thereby increasing the noise immunity of network 350. LPF 236 filters output voltage $V_{MOD\_I}$ to remove any high frequency noise and ADC 238 digitizes filtered output voltage $V_{MOD\_I}$ to form a digital code $Z_{MAG216}$ at output terminal 239 that represents the magnitude of the impedance for load 216, i.e., the digitized signal represents the magnitude of the in-phase component of the impedance of load 216.

Similarly, switches 304 and 312 are opened and closed to multiply signals $V_{rxn}\_Q(fc)$ and inverted signal $V_{SP}B(fc)$ with each other and to multiply signal $V_{rxp}\_Q(fc)$ and $V_{SP}(fc)$ with each other. The multiplication of these signals forms product signals that are combined to form voltage signal $V_{MOD\_Q}$ at input terminal 246 of LPF 248. LPF 248 filters output voltage $V_{MOD\_Q}$ to remove any high frequency noise and ADC 250 digitizes filtered output voltage $V_{MOD\_Q}$ to form a digital code $Z_{PHASE216}$ at output terminal 252 that represents the phase of the impedance for load 216, i.e., the digitized signal represents the quadrature component of the impedance of load 216.

Figure 10:
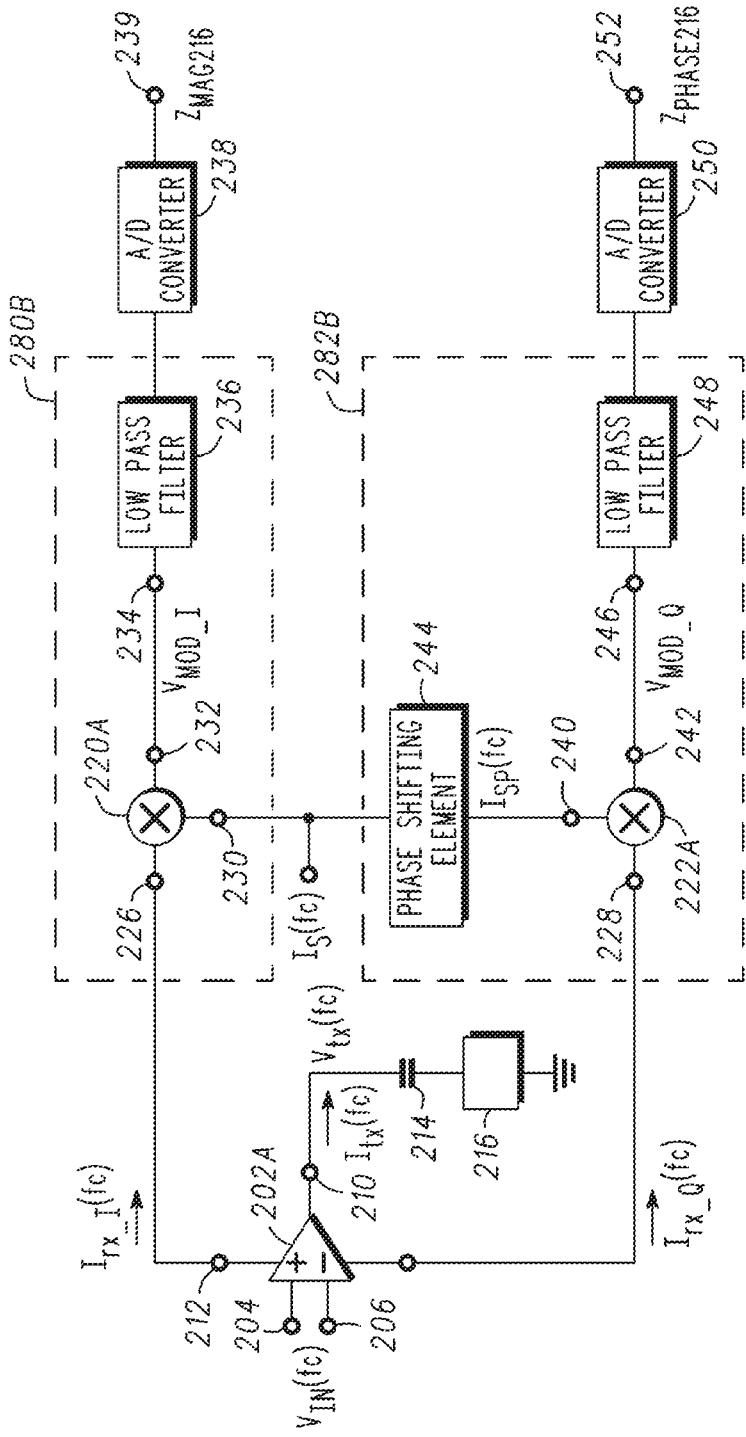
FIG. 10 is a schematic diagram of a measurement circuit in accordance with another embodiment of the present invention.

FIG. 10 is a schematic diagram of a circuit element parameter measurement network 370 in accordance with another embodiment of the present invention. Network 370 is similar to network 200 except that OTA 202 is replaced with OTA 202A and current-to-voltage converter 218 is absent from network 370. In addition, modulators 220 and 222 are replaced with modulators 220A and 222A which are configured to receive current rather than a voltage. The operation of network 370 is similar to that of network 200 except that mixers 220A and 222A mix currents rather than voltages. Modulator 220A and LPF 236 form an in-phase or real impedance detector 280B. Modulator 222A and LPF 248 form a quadrature impedance detector 282B. Quadrature impedance detector 282B is also referred to as an imaginary impedance detector or a reactive impedance detector.

Figure 11:
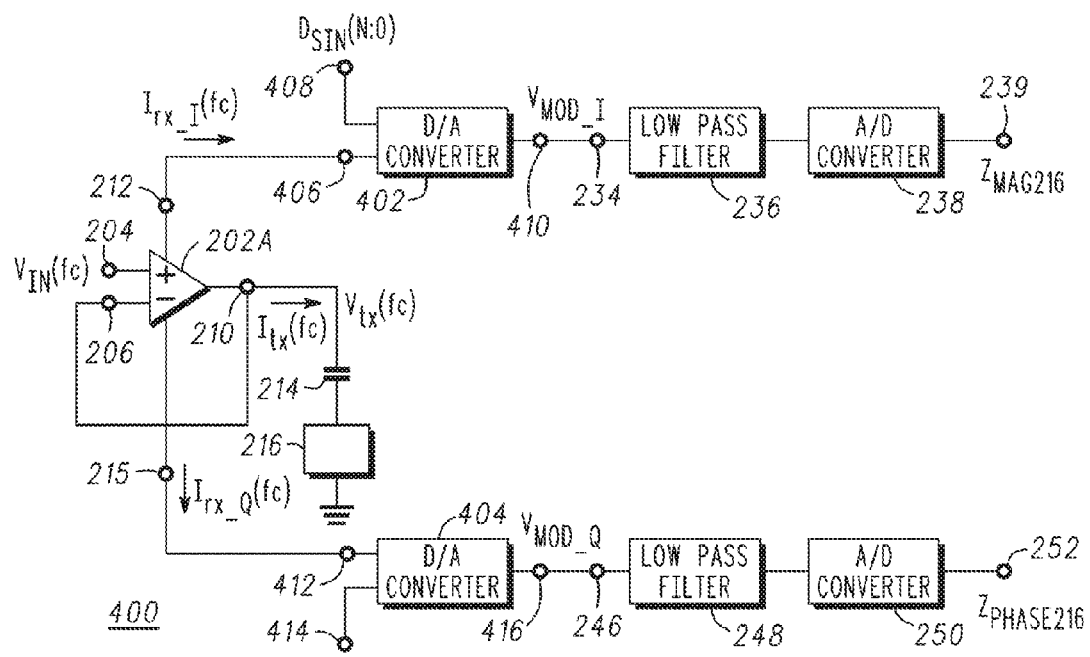
FIG. 11 is a schematic diagram of a measurement circuit in accordance with another embodiment of the present invention.

FIG. 11 is a schematic diagram of a circuit element parameter measurement network 400 in accordance with another embodiment of the present invention. What is shown in FIG. 11 is OTA 202A coupled to load 216 through capacitor 214. The configuration of network 400 is similar to that of network 350 except that switches 284 and 296 and inverter 292 are replaced by a Digital-to-Analog Converter (DAC) 402 and switches 304 and 312 and inverter 320 are replaced by a DAC 404. More particularly, DAC 402 has an input terminal 406 connected to output terminal 212 of OTA 202A, an input terminal 408 coupled for receiving an input signal $D_{SIN}[N:0]$, and an output terminal 410 connected to input terminal 234 of LPF 236. DAC 404 has an input terminal 412 connected to output terminal 215 of OTA 202A, an input terminal 414 coupled for receiving an input signal $D_{COS}[N:0]$ and an output terminal 416 connected to input terminal 246 of LPF 248. Signals $D_{SIN}[N:0]$ and $D_{COS}[N:0]$ are also referred to as digital codes.

In operation, input voltage $V_{IN}(fc)$ is applied at input terminal 204 of OTA 202A. In response to input voltage $V_{IN}(fc)$, OTA 202A generates a current $I_{tx}(fc)$ that flows from output terminal 210 through capacitor 214 and into load 216 thereby generating a voltage $V_{tx}(fc)$ at output terminal 210. Because output terminal 210 is connected to input terminal 206, voltage $V_{tx}(fc)$ appears at input terminal 206. Thus, OTA 202A buffers input signal $V_{IN}(fc)$ to load 216. In addition, OTA 202 generates copies $I_{rx\_I}(fc)$ and $I_{rx\_Q}(fc)$ of current $I_{tx}(fc)$ and conducts the currents $I_{rx\_I}(fc)$ and $I_{rx\_Q}(fc)$ through output terminals 212 and 215, respectively. The copies of current $I_{tx}(fc)$ are labeled $I_{rx\_I}(fc)$ and $I_{rx\_Q}(fc)$ and each current is referred to as a copy current or a copied current. Current $I_{rx\_I}(fc)$ is transmitted to DAC 402 which modulates current $I_{rx\_I}(fc)$ by digital input code $D_{SIN}[N:0]$ and generates a voltage $V_{MOD\_I}$ that appears at output terminal 410. LPF 236 filters output voltage $V_{MOD\_I}$ to remove any high frequency noise and ADC 238 digitizes filtered output voltage $V_{MOD\_I}$ to form a digital code $Z_{MAG216}$ at output terminal 239 that represents the magnitude of the impedance of load 216, i.e., the digitized signal represents the magnitude of the in-phase component of the impedance of load 216.

Current $I_{rx\_Q}(fc)$ is transmitted to DAC 404 which modulates current $I_{rx\_Q}(fc)$ by digital input code $D_{COS}[N:0]$ and generates a voltage $V_{MOD\_Q}$ that appears at output terminal 416. LPF 248 filters output voltage $V_{MOD\_Q}$ to remove any high frequency noise and ADC 250 digitizes filtered output voltage $V_{MOD\_Q}$ to form a digital code $Z_{PHASE216}$ at output terminal 252 that represents the phase of the impedance of load 216, i.e., the digitized signal represents the quadrature component of the impedance of load 216.

It should be noted that network 400 has been shown as modulating currents $I_{rx\_I}(fc)$ and $I_{rx\_Q}(fc)$ using sinusoidal current input codes. However, currents $I_{rx\_I}(fc)$ and $I_{rx\_Q}(fc)$ may be converted to voltage signals so that DAC's 402 and 404 modulate voltage signals using sinusoidal digital voltage input codes, i.e., in this embodiment digital codes $D_{SIN}[N:0]$ and $D_{COS}[N:0]$ are digital voltage signals.

Figure 12:
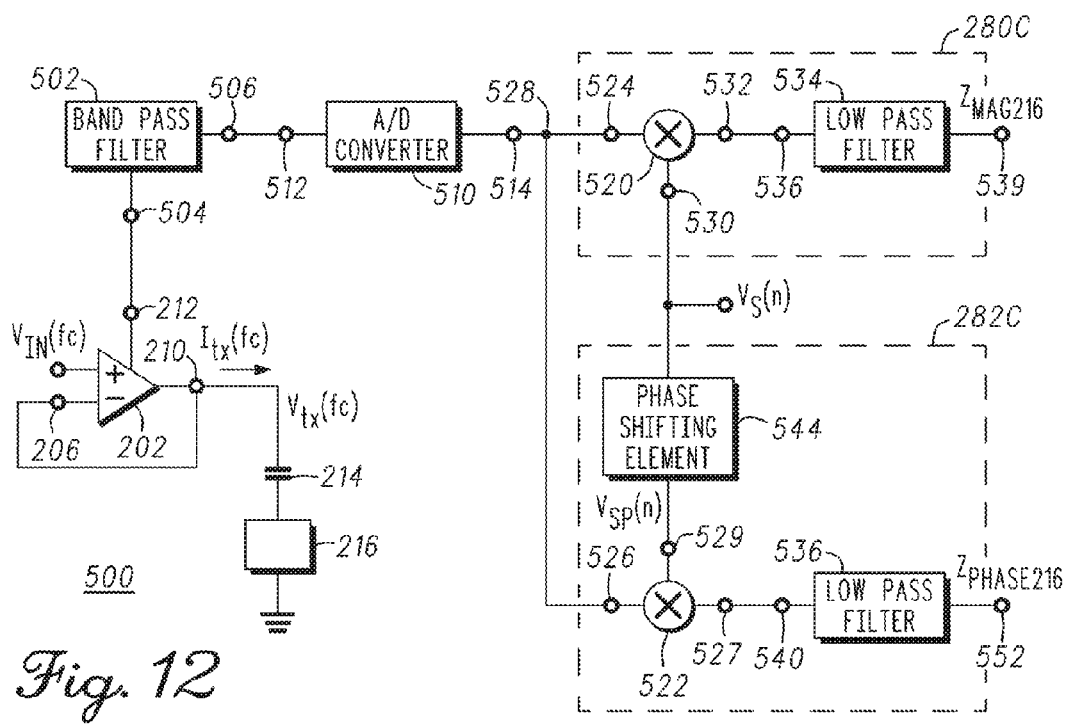
FIG. 12 is a schematic diagram of a measurement circuit in accordance with another embodiment of the present invention.

FIG. 12 is a schematic diagram of a circuit element parameter measurement network 500 in accordance with another embodiment of the present invention. Network 500 includes OTA 202, capacitor 214, and load 216 which have been described above with reference to FIG. 2. In addition, network 500 includes a bandpass filter 502 having an input terminal 504 connected to output terminal 212 of OTA 202 and an output terminal 506 connected to an input terminal 512 of an Analog-to-Digital Converter (ADC) 510. ADC 510 has an output terminal 514 connected to modulators 520 and 522. An input terminal 524 of modulator 520 and an input terminal 526 of modulator 522 are connected to output terminal 514 to form a node 528. Modulator 520 also has an input terminal 530 coupled for receiving a modulation signal $V_S(n)$ and an output terminal 532 connected to an input terminal 536 of a Low Pass Filter (LPF) 534. Modulation signal $V_S(n)$ may be a digitized periodic signal such as, for example, a sine wave, a square wave, a saw tooth wave, etc. Preferably, modulation signal $V_S(n)$ is a digitized sine wave. It should be noted that modulation signal $V_S(n)$ is the same type of signal as input signal $V_{IN}(fc)$ and has the same frequency as input signal $V_{IN}(fc)$. An output signal $Z_{MAG216}$ appears at an output terminal 539 of LPF 534, where output signal $Z_{MAG216}$ represents the magnitude of the impedance for load 216, i.e., the digitized signal represents the magnitude of the in-phase component of the impedance of load 216. Modulator 520 and LPF 534 form an in-phase or real impedance detector 280C.

Modulator 522 has an input terminal 529 coupled for receiving a modulation signal $V_{SP}(n)$ through a phase shifting element 544, and an output terminal 527 coupled to an input terminal 540 of a LPF 536. Phase shifting element 544 shifts the phase of modulation signal $V_S(n)$ to produce a phase shifted modulation signal $V_{SP}(n)$ that has the same frequency and amplitude as modulation signal $V_S(n)$, but a different phase. For example, signals $V_S(n)$ and $V_{SP}(n)$ may have a phase difference of ninety degrees, e.g., signal $V_{SP}(n)$ is ninety degrees out of phase from signal $V_S(n)$. An output signal $Z_{PHASE216}$ appears at an output terminal 552 of LPF 536, where output signal $Z_{PHASE216}$ represents the phase of the impedance for load 216, i.e., the digitized signal represents the quadrature component of the impedance of load 216. Modulator 522 and LPF 536 form a quadrature impedance detector 282C. Quadrature impedance detector 282C is also referred to as an imaginary impedance detector or a reactive impedance detector.

Figure 13:
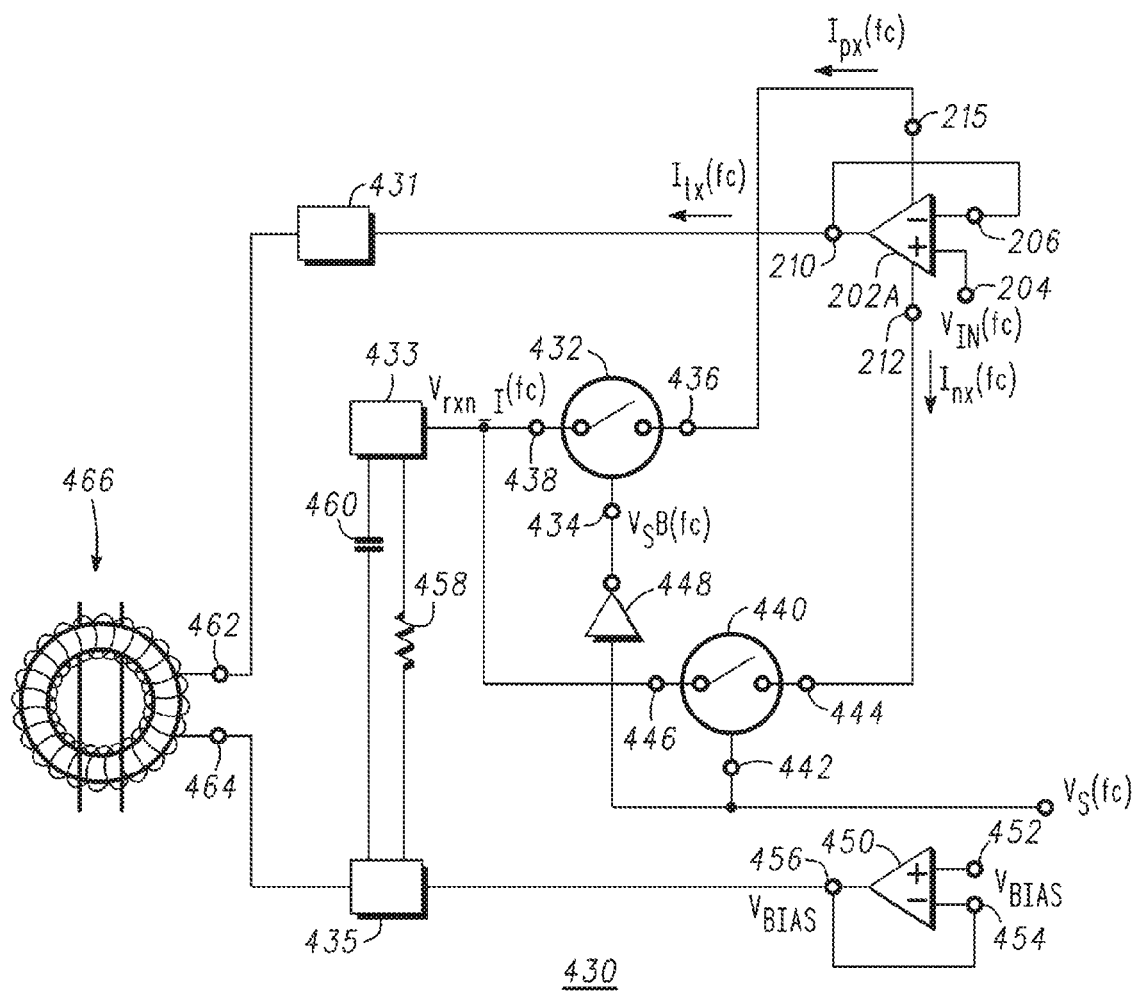
FIG. 13 is a schematic diagram of a measurement circuit in accordance with another embodiment of the present invention.

FIG. 13 is a schematic diagram of a circuit element parameter measurement network 430 in accordance with another embodiment of the present invention. What is shown in FIG. 13 is OTA 202A having input terminals 204 and 206 and output terminals 210, 212, and 215. Input terminal 204 is coupled for receiving an input signal $V_{IN}(fc)$ and input terminal 206 is coupled to output terminal 210, which is connected to an input/output node 431. Output terminal 215 is coupled to an input/output node 433 through a switch 432 and output terminal 212 is coupled to input/output node 433 through a switch 440. More particularly, switch 432 has a control terminal 434 coupled for receiving an input signal $V_S(fc)$ through an inverter 448, a terminal 436 connected to output terminal 215, and a terminal 438 connected to input/output node 433. Inverter 448 inverts signal VS(fc) to generate a signal $V_SB(fc)$ which appears at terminal 434. Switch 440 has a control terminal 442 coupled for receiving input signal $V_S(fc)$, a terminal 444 connected to output terminal 212 and a terminal 446 connected to input/output node 433 and to terminal 438 of switch 432.

Network 430 further includes an operational amplifier 450 having a non-inverting input terminal 452, an inverting input terminal 454, and an output terminal 456, where non-inverting input terminal 452 is coupled for receiving a bias signal $V_{BIAS}$ and inverting input terminal 454 is coupled to output terminal 456 and to an input/output node 435. Output terminal 456 of operational amplifier 450 is coupled to output terminals 438 and 446 and to input/output node 433 through a resistor 458. A filtering capacitor 460 is connected between input/output node 433 and input/output node 435. In addition, input/output nodes 431 and 435 are connected to terminals 462 and 464 of a current transformer 466. Preferably, current transformer 466 is a single wound single current transformer circuit. Although resistor 458 and filtering capacitor 460 have been shown as a resistor and a capacitor that are external to a semiconductor chip from which OTA 202A, operational amplifier 450, and switches 432 and 440, and inverter 448 are manufactured, this is not a limitation of the present invention. Resistor 458 may be an on-chip resistor, filtering capacitor 460 may be an on-chip capacitor, or one of resistor 458 and filtering capacitor 460 may be a filtering capacitor. It should be noted that input/output nodes 431, 433, and 435 may be input/output pins of a package semiconductor chip.

In operation, a sinusoidal signal $V_{IN}(fc)$ is applied to input terminal 204. In response to sinusoidal input signal $V_{IN}(fc)$, OTA 202A generates a current $I_{rx}(fc)$ that flows from output terminal 210 to terminal 462 of current transformer 466. In addition, OTA 202A generates copies $I_{nx}(fc)$ and $I_{px}(fc)$ of current $I_{rx}(fc)$ and conducts the currents $I_{nx}(fc)$ and $I_{px}(fc)$ through output terminals 212 and 215, respectively. Voltage $V_{BIAS}$ is connected to input terminal 452 of operational amplifier 450 and is transmitted to output terminal 456. Bias voltage $V_{BIAS}$ is transmitted to terminal 464 of current transformer 466. Switches 432 and 440 are opened and closed in accordance with input voltage $V_S(fc)$ that is input to control terminal 442.

Figure 14:
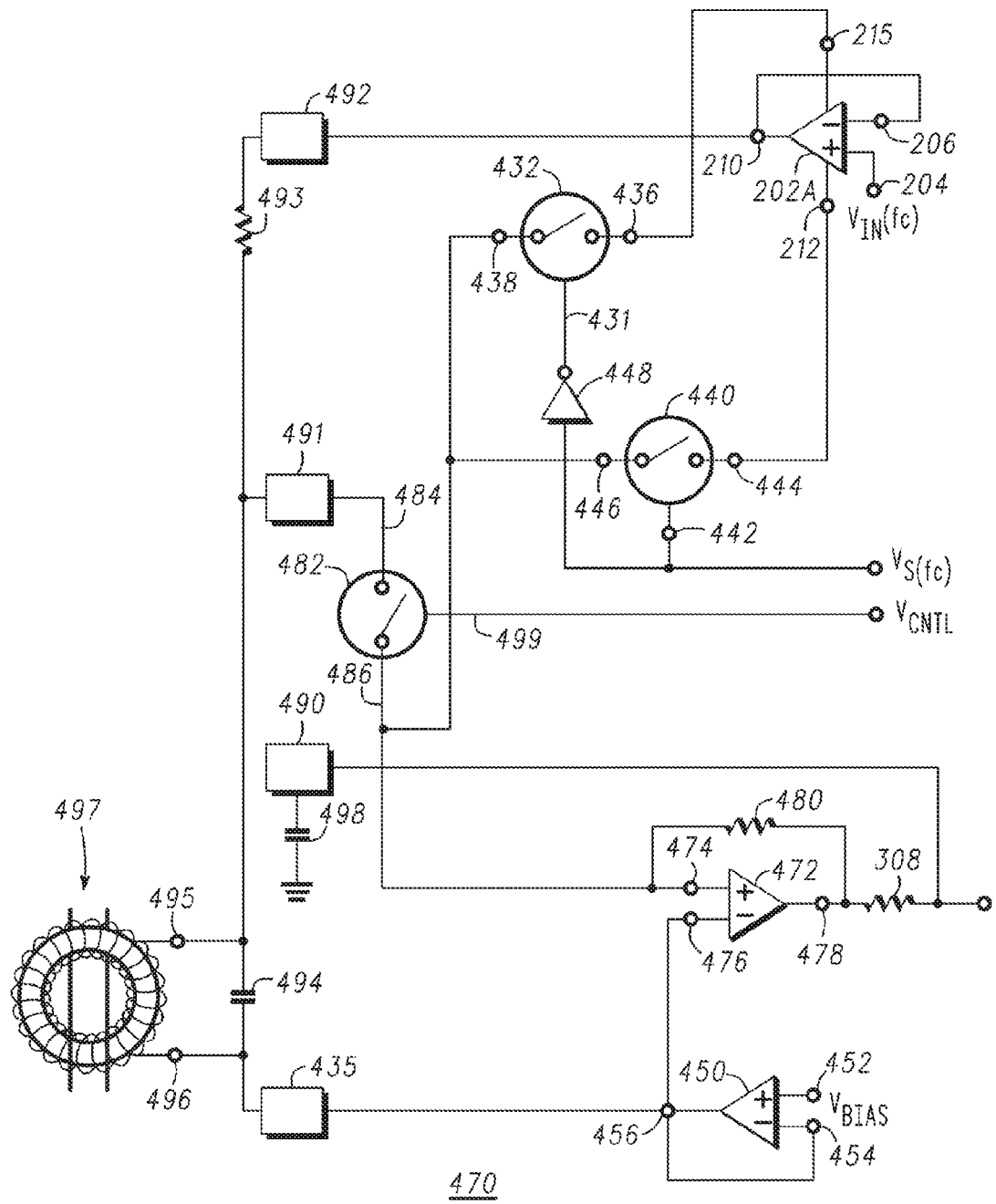
FIG. 14 is a schematic diagram of a measurement circuit in accordance with another embodiment of the present invention.

FIG. 14 is a schematic diagram of a circuit element parameter measurement network 470 in accordance with another embodiment of the present invention. What is shown in FIG. 14 is OTA 202A, operational amplifier 450, and switches 432 and 440. Output terminal 210 is connected to an input/output node 492 which is connected to a terminal 496 of current transformer 497 through a series connected resistor 493 and capacitor 494. It should be noted that capacitor 494 is an optional component that may be omitted. The connection of output terminals 212 and 215 and switches 432 and 440 have been described with reference to network 430 shown in FIG. 13. It should be noted that the connection of terminals 438 and 440 of switches 432 and 440, respectively, are different from that described above with reference to FIG. 13 and will be described below.

Network 470 further includes an operational amplifier 472 having a non-inverting input terminal 474 coupled to an output terminal 478 through a resistor 480. Output terminal 478 is coupled to an input/output node 490 through a resistor 308. Input/output node 490 is coupled to ground through, for example, a capacitor 498. Operational amplifier 472 has an inverting input terminal 476 commonly connected to output terminal 456, input/output node 435, and terminal 496. Terminals 438 and 446 of switches 432 and 440, respectively, are commonly connected to terminal 486 of switch 482 and to non-inverting input terminal 474. Switch 482 has a control terminal 499 coupled for receiving input signal $V_{CNTL}$, a terminal 484 connected to node 491, and a terminal 486 commonly connected to non-inverting input terminal 474 of operational amplifier 472 and to terminal 438 of switch 432. A terminal of resistor 493, a terminal of capacitor, and a terminal 495 of current transformer 497 of current transformer 497. The other terminal of capacitor 494 is commonly connected to input/output pad 435 and to input terminal 496 of current transformer 497. Preferably, current transformer 497 is a single wound single current transformer circuit. Input/output pads 435, 490, 491, and 492 may be input/output pins of a packaged semiconductor chip.

Figure 15:
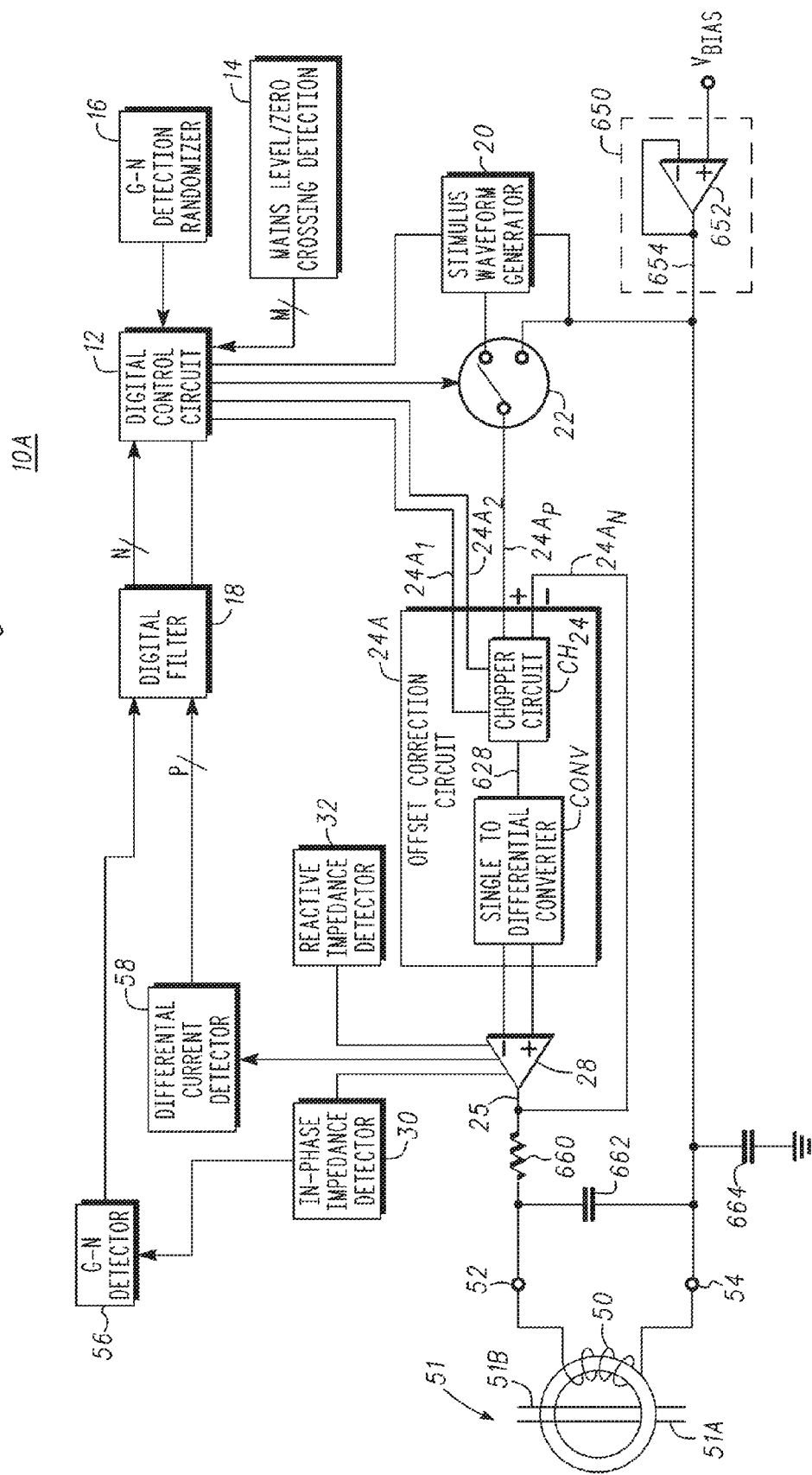
FIG. 15 is a schematic diagram of an offset correction circuit in accordance with another embodiment of the present invention.

FIG. 15 is a circuit diagram of a GFCI module 10A that includes digital control circuit 12 coupled for receiving input signals from a mains level/zero crossing detector circuit 14, ground-to-neutral (G-N) detection randomizer 16, digital filter 18, stimulus waveform generator 20, switch 22, amplifier 28, impedance detectors 32 and 34, G-N detector 56, differential current detector 58, and current transformer 51 described with reference to FIG. 1. It should be noted that a line conductor 51A and a neutral conductor 51B are associated with current transformer 51 and coil 50 and are part of the AC power system. Stimulus waveform generator 20 may be referred to as a signal generator and may include a digital-to-analog converter and as discussed above, amplifier 28 may be an operational transconductance amplifier. In addition, GFCI module 10A includes an offset correction circuit 24A, also referred to as an offset correction block or an offset correction network, having an inverting input terminal commonly connected to an output terminal 25 of amplifier 28 and to terminal 52 of the primary windings 50 of a current transformer 51 and a non-inverting input terminal connected to a conduction terminal of switch 22. Output terminals of offset correction circuit 24A are connected to corresponding input terminals of amplifier 28. More particularly, an output terminal of offset correction circuit 24A is connected to the inverting input terminal of amplifier 28 and another output terminal of offset correction circuit 24A is connected to a non-inverting input terminal of amplifier 28. In accordance with an embodiment of the present invention, offset correction circuit 24A comprises a chopper circuit $CH_{24}$ such as, for example, chopper circuit $CH_{24}$ shown in FIG. 16 connected to a single-ended to differential converter CONV. Outputs of converter CONV are connected corresponding inputs of amplifier 28. Chopper circuit $CH_{24}$ may be referred to as a zero-drift amplifier or a chopper amplifier.

Figure 16:
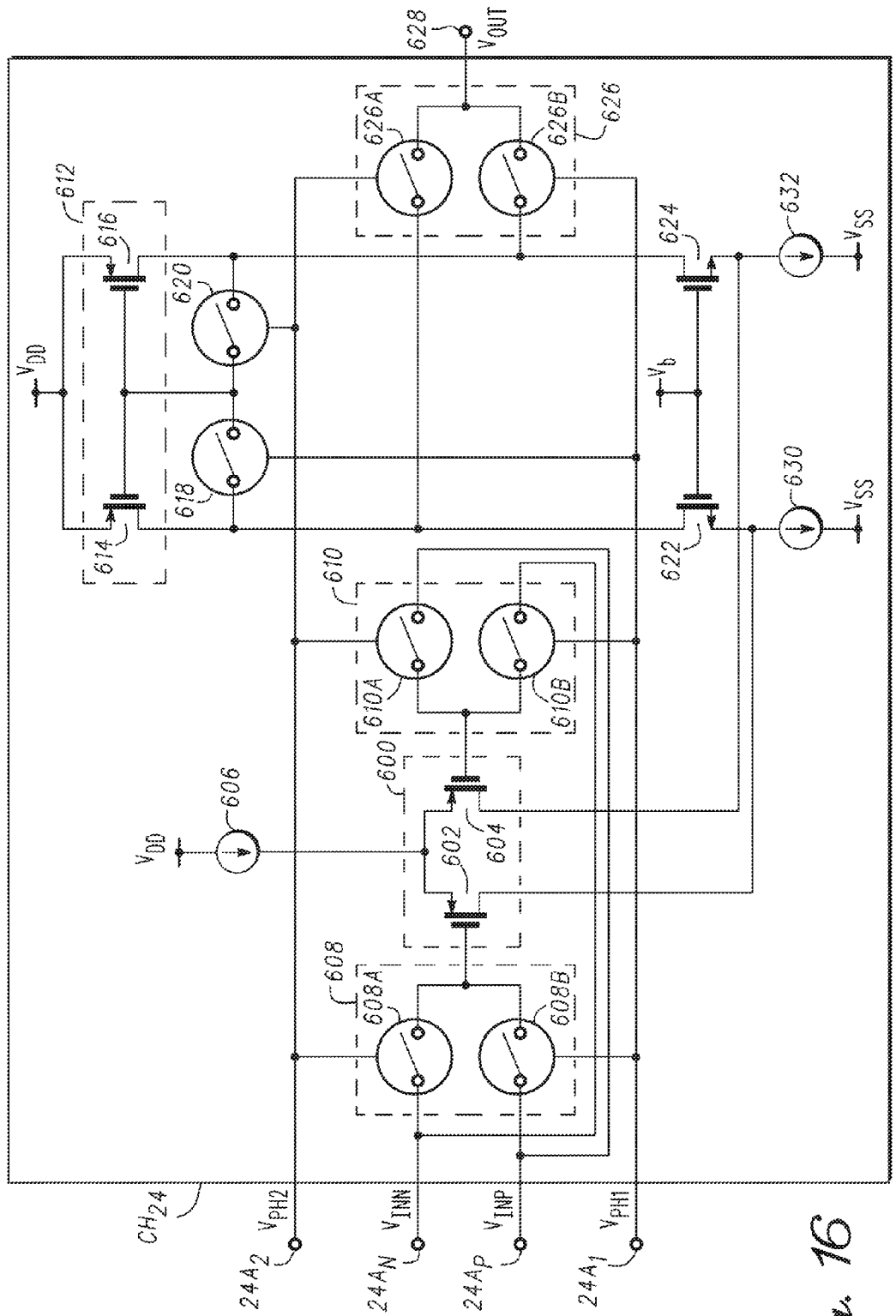
FIG. 16 is a schematic diagram of a chopper module in accordance with an embodiment of the present invention.

Briefly referring to FIG. 16, a circuit configuration for chopper circuit $CH_{24}$ in accordance with an embodiment of the present invention is illustrated. Chopper circuit $CH_{24}$ includes a differential pair of transistors 600 comprising p-channel transistors 602 and 604 having their sources commonly connected together and to a terminal of a current source 606. The other terminal of current source 606 is coupled for receiving a source of operating potential such as, for example, $V_{DD}$. The gate of transistor 602 is connected to a switching network 608 and the gate of transistor 604 is connected to a switching network 610. Switching network 608 includes switches 608A and 608B, wherein each switch 608A and 608B has a conduction terminal commonly connected together and to the gate of transistor 602. Switch 608A has a conduction terminal coupled for receiving an input signal $V_{INN}$ at input $24A_N$ and a control terminal coupled for receiving a control signal $V_{PH2}$ at input $24A_2$. Switch 608B has a conduction terminal coupled for receiving an input signal $V_{INP}$ at input $24A_P$ and a control terminal coupled for receiving a control signal $V_{PH1}$ at input $24A_1$.

Switching network 610 includes switches 610A and 610B, wherein each switch 610A and 610B has a conduction terminal commonly connected together and to the gate of transistor 604. Switch 610A has a conduction terminal coupled for receiving an input signal $V_{INP}$ at input $24A_P$ and a control terminal coupled for receiving a control signal $V_{PH2}$ at input $24A_2$. Switch 610B has a conduction terminal coupled for receiving an input signal $V_{INN}$ at input $24A_N$ and a control terminal coupled for receiving a control signal $V_{PH1}$ at input $24A_1$.

Chopper circuit $CH_{24}$ further includes a differential pair 612 comprising p-channel transistors 614 and 616 having their sources commonly connected together and for receiving a source of operating potential such as, for example, $V_{DD}$. The gates of transistors 614 and 616 are commonly connected together and to conduction terminals of switches 618 and 620. Switch 618 has another conduction terminal connected to the drain of transistor 614 and switch 620 has another conduction terminal connected to the drain of transistor 616. The control terminals of switches 618 and 620 are connected for receiving control signals $V_{PH1}$ and $V_{PH2}$, respectively. In addition, the drain of transistor 614 is connected to the drain of a transistor 622 and to a switching network 626 and the drain of transistor 616 is connected to the drain of a transistor 624 and to switching network 626. The gates of transistors 622 and 624 are connected together for receiving a source of potential $V_b$. The source of transistor 622 is connected to the drain of transistor 602 and to a terminal of a current source 630 and the source of transistor 624 is connected to the drain of transistor 604 and to a terminal of a current source 632. Current sources 630 and 632 have terminals coupled for receiving a source of operating potential such as, for example, $V_{SS}$. Transistors 622 and 624 are referred to as biasing transistors.

Switching network 626 includes switches 626A and 626B, wherein each switch 626A and 626B has a conduction terminal commonly connected together to form an output 628. Switch 626A has a terminal connected to the drains of transistors 614 and 622 and switch 626B has a terminal connected to the drains of transistors 616 and 624. The control terminals of switches 626A and 626B are connected for receiving control signals $V_{PH2}$ and $V_{PH1}$, respectively.

Referring again to FIG. 15, GFCI module 10A further includes a biasing module 650 having an input coupled for receiving a bias signal $V_{BIAS}$, an output connected to a conduction terminal of switch 22 and to an input of a stimulus waveform generator 20 and to terminal 54 of windings 50. Switch 22 also has a terminal coupled for receiving a control signal from digital control circuit 12. By way of example, biasing module 650 may be comprised of an amplifier 652 having a non-inverting input, an inverting input, and an output 654, wherein the inverting input is connected to output 654 of amplifier 652 and the non-inverting input may be coupled for receiving bias voltage $V_{BIAS}$. Output 654 of amplifier 652 may be coupled to or alternatively, may serve as the output of biasing module 650. Biasing module 650 may also be referred to as a bias generator.

A resistor 660 may be connected between output 25 and terminal 52 and a filter capacitor 662 may connected between outputs 25 and 654 and a bypass capacitor 664 may be connected between output 654 and a source of operating potential such as, for example, ground.

In operation, control circuit 12 generates a control signal for configuring offset correction circuit 10A to generate offset signals in response to operating in the differential offset correction mode (ground fault mode) or in the grounded-neutral offset correction mode. In addition, control circuit 12 provides control signals for switching networks 608, 610, 617, and 626 of chopper circuit $CH_{24}$. It should be noted that control circuit 12 may be programmed to enable offset correction circuit 10A to operate in each operating mode for substantially the same amount of time or to operate in each mode for different amounts of time. Thus, circuit 12 may be programmed to configure offset correction circuit 10A to operate in the differential offset correction mode for longer than it operates in the grounded-neutral offset correction mode. For example, circuit 12 may be programmed to operate offset correction circuit 10A in the differential offset correction mode for about 95% of the time and in the grounded-neutral offset correction mode about 5% of the time. In response to a control signal for operation in the differential operating mode, switch 22 is configured to connect stimulus waveform generator 20 to offset correction circuit 24A and in response to a control signal for operation in the grounded-neutral operating mode, switch 22 is configured to connect bias generator 650 to offset correction circuit 24A. Referring to FIGS. 15 and 16, chopper circuit $CH_{24}$, i.e., offset correction circuit 24A, receives an input signal from stimulus waveform generator 20 at inverting input $24A_P$ when operating in the differential offset correction mode or from bias generator 650 when operating in the grounded-neutral offset correction mode. It should be noted that output terminal 25 of amplifier 28 is connected to input $24A_N$. Chopper circuit $CH_{24}$ multiplexes the signals received at inputs $24A_P$ and $24A_N$ from stimulus waveform generator 20 and amplifier 28, respectively, in the time domain and in response to control signals $V_{PH1}$ and $V_{PH2}$ to reduce offset current from amplifier 28. Thus, chopper circuit $CH_{24}$ corrects the input offset voltage of amplifier 28.

In accordance with another embodiment, GFCI module 10A dynamically corrects offsets associated with an AC power system by decreasing an offset current generated in response to a grounded-neutral fault stimulus or decreasing an offset current generated in response to a differential fault stimulus. The offset current generated in response to the differential fault stimulus may be generated using an inductance of current transformer 51.

Figure 17:
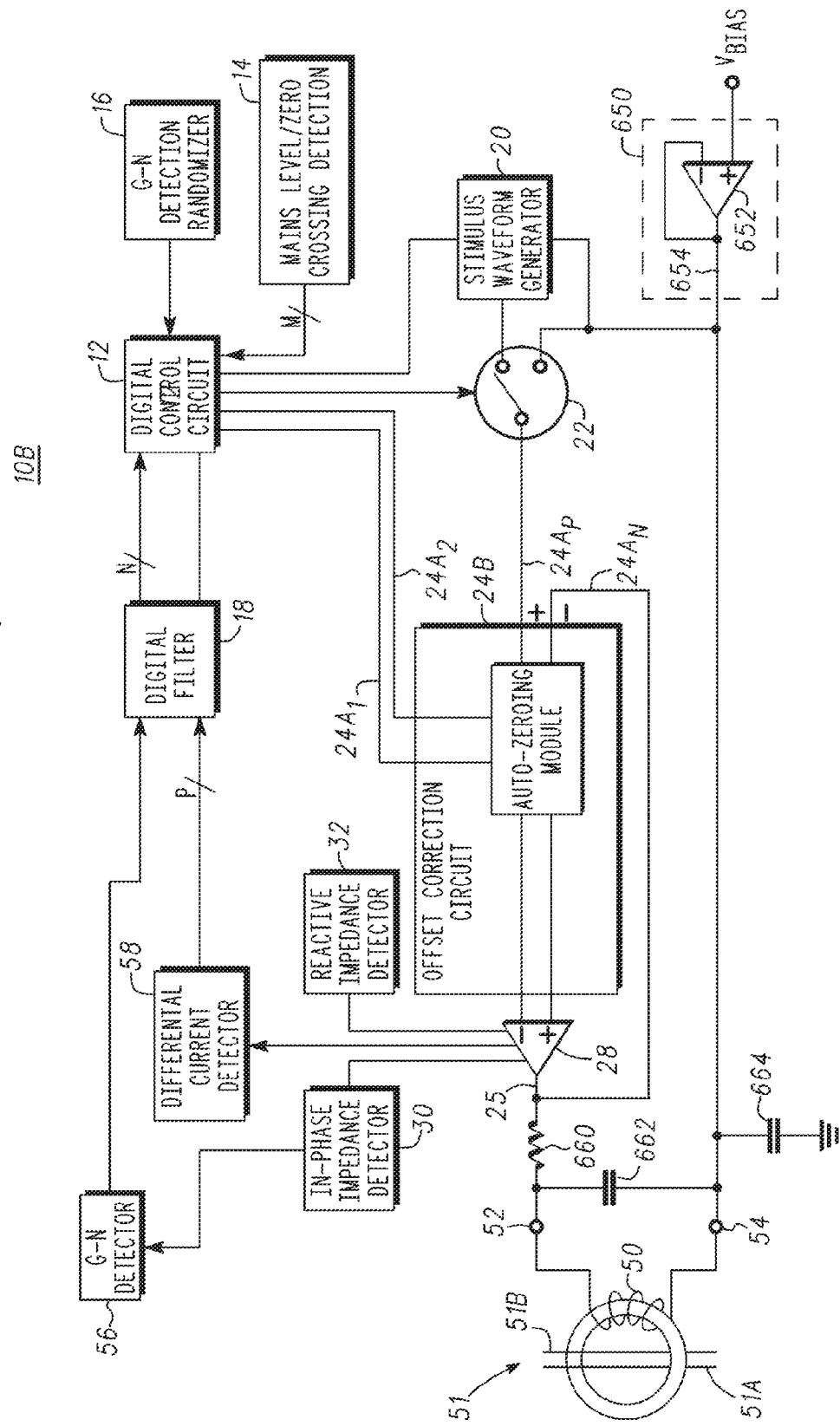
FIG. 17 is a schematic diagram of an offset correction circuit in accordance with another embodiment of the present invention.

FIG. 17 is a circuit diagram of a GFCI module 10B that includes digital control circuit 12 coupled for receiving input signals from a mains level/zero crossing detector circuit 14, ground-to-neutral (G-N) detection randomizer 16, digital filter 18, stimulus waveform generator 20, switch 22, amplifier 28, impedance detectors 32 and 34, G-N detector 56, differential current detector 58, and current transformer 51 described with reference to FIG. 1. As discussed above, amplifier 28 may be an operational transconductance amplifier. In addition, GFCI module 10B includes an offset correction circuit 24B, also referred to as an offset correction block or an offset correction network, having an inverting input terminal $24A_N$ commonly connected to an output terminal 25 of amplifier 28 and to terminal 52 of the primary windings 50 of a current transformer 51 and a non-inverting input terminal $24A_P$ connected to a terminal of switch 22. Output terminals of offset correction circuit 24B are connected to corresponding input terminals of amplifier 28. More particularly, an output terminal of offset correction circuit 24B is connected to the inverting input terminal of amplifier 28 and another output terminal of offset correction circuit 24B is connected to a non-inverting input terminal of amplifier 28. In accordance with an embodiment of the present invention, offset correction circuit 24B comprises an auto-zeroing circuit $AZ_{24}$. Like chopper circuit $CH_{24}$, auto-zeroing circuit $AZ_{24}$ corrects the input offset voltage of amplifier 28. Thus, in operation in accordance with an embodiment, auto-zeroing circuit $AZ_{24}$ auto-zeros a sine wave in response to detecting a grounded-neutral fault.

By now it should be appreciated that a dynamic offset correction circuit and method for dynamically correcting offsets associated with an AC power system have been provided. The method allows for dynamically correcting offsets associated with an AC power system by decreasing an offset current generated in response to a ground to neutral fault stimulus; and decreasing an offset current generated in response to a differential fault stimulus. In accordance with an embodiment, an offset correction circuit chops the offset of driver amplifiers connected to a current transformer. An advantage of the dynamic offset correction circuit is that it eliminates the need for connecting an AC coupling capacitor between a current transformer and a driver amplifier. In addition, the dynamic offset correction circuit allows for the use of a current transformer having a significantly lower inductance at the secondary, e.g. lowering the inductance at the secondary by about a factor of about two. Including a circuit element that auto-zeros a sine wave minimizes the offset current caused by the current transformer inductance in response to a grounded neutral stimulus.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A device configured to dynamically correct offsets associated with an AC power system that includes a line conductor, a neutral conductor, and a transformer, the device comprising:
    an offset correction circuit having first and second inputs and first and second outputs, the offset correction circuit comprising one of a chopper circuit or an auto-zeroing circuit;
    a first amplifier having first and second inputs and an output, the first and second inputs coupled to the first and second outputs of the offset correction circuit, respectively, and the output of the amplifier coupled to the second input of the offset correction circuit;
    a signal generator switchably coupled to the first input of the offset correction circuit; and
    a bias generator switchably coupled to the first input of the offset correction circuit.

2. The device of claim 1, further including a switch coupled between the first input of the offset correction circuit and the signal generator and between the first input of the offset correction circuit and the bias generator.

3. The device of claim 2, wherein the offset correction circuit comprises the chopper circuit.

4. The device of claim 1, wherein the chopper circuit comprises:
    a first differential pair of transistors having first and second control electrodes, first and second current carrying electrodes, and a common electrode;

a first switching network coupled between the first control electrode of the first differential pair of transistors and the first input of the offset correction circuit; and a second switching network coupled between the second control electrode of the first pair differential pair of transistors and the second input of the offset correction circuit.

5. The device of claim 4, wherein the first switching network comprises:

a first switch having a control terminal, a first conduction terminal, and a second conduction terminal, the first conduction terminal of the first switch coupled to the control electrode of the first differential pair of transistors, the second conduction terminal of the first switch coupled to the first input of the offset correction circuit, and the control terminal of the first switch coupled to a third input of the offset correction circuit; and a second switch having a control terminal, a first conduction terminal, and a second conduction terminal, the first conduction terminal of the second switch coupled to the first control electrode of the first differential pair of transistors and to the first conduction terminal of the first switch, the second conduction terminal of the second switch coupled to the second input of the offset correction circuit, and the control terminal of the second switch coupled to a fourth input of the offset correction circuit.

6. The device of claim 5, wherein the second switching network comprises:

a third switch having a control terminal, a first conduction terminal, and a second conduction terminal, the first conduction terminal of the third switch coupled to the second control electrode of the first differential pair of transistors, the second conduction terminal of the third switch coupled to the second input of the offset correction circuit and to the second conduction terminal of the second switch, and the control terminal of the third switch coupled to the third input of the offset correction circuit; and a fourth switch having a control terminal, a first conduction terminal, and a second conduction terminal, the first conduction terminal of the fourth switch coupled to the second control electrode of the first differential pair of transistors and to the first conduction terminal of the third switch, the second conduction terminal of the fourth switch coupled to the first input of the offset correction circuit and to the second conduction terminal of the first switch, and the control terminal of the second switch coupled to the fourth input of the offset correction circuit.

7. The device of claim 5, further including:

a first current source coupled to the common electrode of the first pair of differential transistors;

a second current source coupled to the first current carrying electrode of the first pair of differential transistors; and a third current source coupled to the second current carrying electrode of the first pair of differential transistors.

8. The device of claim 6, wherein the chopper circuit further comprises:

a second differential pair of transistors having first and second control electrodes and first and second current carrying electrodes, the first and second control electrodes coupled together, the first current carrying electrode of the second pair of differential transistors coupled to the first current carrying electrode of the first differential pair of transistors and the second current carrying electrode of the second pair of differential transistors coupled to the second current carrying electrode of the first differential pair of transistors; and a third switching network coupled to the first and second current carrying electrodes of the second differential pair of transistors.

9. The device of claim 8, wherein the third switching network comprises:

a fifth switch having a control terminal, a first conduction terminal, and a second conduction terminal, the control terminal of the fifth switch coupled to the control terminal of the first switch, to the control terminal of the third switch, and to the third input of the offset correction circuit, the first conduction terminal of the fifth switch coupled to the first current carrying terminal of the second differential pair of transistors; and a sixth switch having a control terminal, a first conduction terminal, and a second conduction terminal, the control terminal of the sixth switch coupled to the control terminal of the second switch, to the control terminal of the fourth switch, and to the fourth input of the offset correction circuit, the first conduction terminal of the sixth switch coupled to the first conduction terminal of the fifth switch to form an output of the chopper circuit, and the second conduction terminal of the sixth switch coupled to the second current carrying terminal of the second differential pair of transistors.

10. The device of claim 9, further including:

a seventh switch having a control terminal, a first conduction terminal, and a second conduction terminal, the control terminal of the seventh switch coupled to the control terminal of the first switch, to the control terminal of the third switch, to the control terminal of the fifth switch, and to the third input of the offset correction circuit, the first conduction terminal of the seventh switch coupled to the first current carrying terminal of the second differential pair of transistors and the second conduction terminal of the seventh switch coupled to the first and second control electrodes of the second pair of differential transistors; and an eighth switch having a control terminal, a first conduction terminal, and a second conduction terminal, the control terminal of the eighth switch coupled the control terminal of the sixth switch, coupled to the control terminal of the second switch, coupled to the control terminal of the fourth switch, and coupled to the fourth input of the offset correction circuit, first conduction terminal of the eighth switch coupled to the second current carrying terminal of the second differential pair of transistors and the second conduction terminal of the eighth switch coupled to the first and second control electrodes of the second pair of differential transistors and to the second conduction terminal of the seventh switch.

11. The device of claim 10, further including:

a first transistor having a control electrode, a first current carrying electrode, and a second current carrying electrode, the control electrode of the first transistor coupled for receiving a bias voltage, the first current carrying electrode of the first transistor coupled to the first current carrying electrode of the second differential pair, and the second current carrying electrode of the first transistor coupled to the second current source; and a second transistor having a control electrode, a first current carrying electrode, and a second current carrying electrode, the control electrode of the second transistor coupled for receiving a bias voltage, the first current carrying electrode of the second transistor coupled to the second current carrying electrode of the second differential pair, and the second current carrying electrode of the second transistor coupled to the third current source.

12. The device of claim 1, wherein the bias generator comprises a second amplifier having first and second inputs and an output, the first input of the second amplifier coupled to output of the second amplifier and the second input of the second amplifier coupled for receiving a bias voltage.

13. The device of claim 1, wherein the offset correction circuit comprises the auto-zeroing circuit.

14. A device configured to dynamically correct offsets associated with an AC power system that includes a line conductor, a neutral conductor, and a transformer, the device comprising:

an offset correction circuit having a plurality of input terminals and a plurality of output terminals, the offset correction circuit comprising one of a chopper circuit or an auto-zeroing circuit;

a first amplifier having first and second inputs and a plurality of outputs, the first and second inputs coupled to first and second output terminals of the plurality of output terminals of the offset correction circuit, respectively, and a first output of the plurality of outputs of the amplifier coupled to a first input of the plurality of input terminals of the offset correction circuit;

a first switch having a control terminal, a first conduction terminal, a second conduction terminal, and a third conduction terminal, the first conduction terminal coupled to the a second input terminal of the plurality of input terminals of the offset correction circuit;

a signal generator coupled to the second conduction terminal of the first switch;

a bias generator coupled to the third conduction terminal of the first switch;

a first detector having an input terminal and an output terminal, the input terminal of the first detector coupled to a second output of the plurality of outputs of the first amplifier; and a control circuit having a plurality of inputs and a plurality of outputs, a first output of the plurality of outputs of the control circuit coupled to the control terminal of the first switch.

15. The device of claim 14, wherein the control circuit is a digital control circuit having a second output of the plurality of outputs of the control circuit coupled to a third input terminal of the plurality of input terminals of the offset correction circuit, a third output of the plurality of outputs of the control circuit coupled to a fourth input of the plurality of input terminals of the offset correction circuit, and a fourth output of the plurality of outputs of the control circuit coupled to the signal generator.

* * * * *